United States Patent
Sano et al.

(10) Patent No.: US 9,177,786 B2
(45) Date of Patent: Nov. 3, 2015

(54) METHOD OF MANUFACTURING SEMICONDUCTOR DEVICE, METHOD OF PROCESSING SUBSTRATE, SUBSTRATE PROCESSING APPARATUS, AND RECORDING MEDIUM

(71) Applicant: HITACHI KOKUSAI ELECTRIC INC., Tokyo (JP)

(72) Inventors: Atsushi Sano, Toyama (JP); Yoshiro Hirose, Toyama (JP); Kiyohiko Maeda, Toyama (JP); Kazuyuki Okuda, Toyama (JP); Ryuji Yamamoto, Kodaira (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 11 days.

(21) Appl. No.: 13/845,781

(22) Filed: Mar. 18, 2013

(65) Prior Publication Data

US 2013/0252437 A1 Sep. 26, 2013

(30) Foreign Application Priority Data

Mar. 21, 2012 (JP) .................................. 2012-64467
Jan. 30, 2013 (JP) .................................. 2013-16237

(51) Int. Cl.
*H01L 21/31* (2006.01)
*H01L 21/02* (2006.01)
*C23C 16/34* (2006.01)
*C23C 16/452* (2006.01)
*C23C 16/455* (2006.01)

(52) U.S. Cl.
CPC .......... *H01L 21/02247* (2013.01); *C23C 16/34* (2013.01); *C23C 16/345* (2013.01); *C23C 16/452* (2013.01); *C23C 16/45542* (2013.01); *C23C 16/45546* (2013.01); *H01L 21/0217* (2013.01); *H01L 21/0228* (2013.01); *H01L 21/02211* (2013.01); *H01L 21/02274* (2013.01)

(58) Field of Classification Search
CPC ............ H01L 21/0217; H01L 21/0228; H01L 21/02252; H01L 21/02274; H01L 21/02219; H01L 21/0234; H01L 21/76856
USPC .................................. 438/758, 762, 769, 788
See application file for complete search history.

(56) References Cited

U.S. PATENT DOCUMENTS

| 2010/0183825 A1* | 7/2010 | Becker et al. .................. 427/569 |
| 2012/0220137 A1* | 8/2012 | Ota et al. ...................... 438/765 |

FOREIGN PATENT DOCUMENTS

| JP | 2007-095905 A | 4/2007 |
| JP | 2010-226084 A | 10/2010 |
| JP | 2011-009699 A | 1/2011 |
| JP | 2011-061037 A | 3/2011 |

* cited by examiner

*Primary Examiner* — Brook Kebede
(74) *Attorney, Agent, or Firm* — Volpe and Koenig, P.C.

(57) ABSTRACT

A method of manufacturing a semiconductor device includes forming a thin film on a substrate by performing a cycle a predetermined number of times. The cycle includes supplying a source gas to the substrate, and supplying excited species from each of a plurality of excitation units provided at a side of the substrate to the substrate. Each of the plurality of excitation units generates the excited species by plasma-exciting a reaction gas. In supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate.

13 Claims, 19 Drawing Sheets

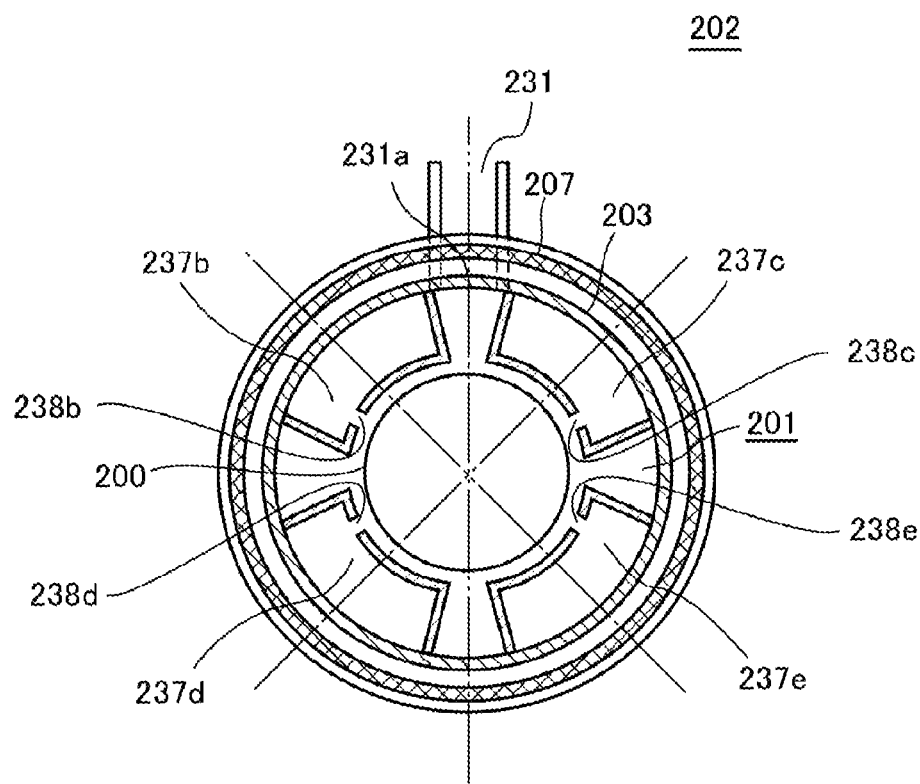

METHOD OF MANUFACTURING SEMICONDUCTOR DEVICE, METHOD OF PROCESSING SUBSTRATE, SUBSTRATE PROCESSING APPARATUS, AND RECORDING MEDIUM

CROSS-REFERENCE TO RELATED APPLICATIONS

This application is based upon and claims the benefit of priority from Japan Patent Applications Nos. 2012-64467, filed on Mar. 21, 2012, and 2013-16237, filed on Jan. 30, 2013, the entire contents of which are incorporated herein by reference.

TECHNICAL FIELD

The present disclosure relates to a method of manufacturing a semiconductor device which includes a process of forming a thin film on a substrate, a method of processing a substrate, a substrate processing apparatus suitable for use in the process, and a recording medium.

BACKGROUND

A process of manufacturing a semiconductor device such as a large scale integrated (LSI) circuit, a static random access memory (SRAM), or a dynamic random access memory (DRAM) may include performing a substrate processing process that forms a thin film, for example, an oxide film, a nitride film, or the like, on a substrate.

SUMMARY

The above described thin film may be formed by performing a cycle a predetermined number of times, the cycle including a process of supplying a source gas to a substrate and a process of supplying, to the substrate, excited species generated by plasma-exciting a reaction gas. In this way, by using the excited species which is generated by plasma-exciting the reaction gas, the thin film may be formed in a low temperature area. In the above described method, however, the in-plane uniformity of the substrate processing, namely, the in-plane film-thickness uniformity or film-quality uniformity of the thin film formed in the substrate may be deteriorated.

The present disclosure provides some embodiments of a method of manufacturing a semiconductor device, a method of processing a substrate, a substrate processing apparatus, and a recording medium, which can enhance processing uniformity in a substrate plane when processing the substrate by using excited species that is generated by plasma-exciting a reaction gas.

According to one embodiment of the present disclosure, provided is a method of manufacturing a semiconductor device, which includes forming a thin film on a substrate by performing a cycle a predetermined number of times. The cycle includes supplying a source gas to a substrate, and supplying excited species to the substrate from each of a plurality of excitation units provided at a side of the substrate. Each of the plurality of excitation units generates the excited species by plasma-exciting a reaction gas. In supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate.

According to another embodiment of the present disclosure, provided is a method of processing a substrate, which includes forming a thin film on a substrate by performing a cycle a predetermined number of times. The cycle includes supplying a source gas to the substrate, and supplying excited species to the substrate from each of a plurality of excitation units provided at a side of the substrate. Each of the plurality of excitation units generates the excited species by plasma-exciting a reaction gas. In supplying the excited species from each of the plurality of excitation units, an in-plane distribution of the excited species supplied from at least one of the plurality of excitation units in the substrate differs from an in-plane distribution the excited species supplied from another excitation unit, other than the at least one excitation unit, among the plurality of excitation units, in the substrate.

According to still another embodiment of the present disclosure, provided is a substrate processing apparatus including a processing chamber configured to accommodate a substrate, a source gas supply system configured to supply a source gas into the processing chamber, a plurality of excitation units, each of which is provided at a side of the substrate inside the processing chamber and configured to plasma-excite a reaction gas, a reaction gas supply system configured to supply the reaction gas to each of the plurality of excitation units, and a controller configured to control the source gas supply system, the reaction gas supply system, and each of the plurality of excitation units such that a thin film is formed on the substrate by performing a cycle a predetermined number of times. The cycle includes supplying the source gas to the substrate inside the processing chamber, and supplying the excited species to the substrate inside the processing chamber from each of the plurality of excitation units provided at the side of the substrate, the excited species being generated by plasma-exciting the reaction gas in each of the plurality of excitation units. Further, in supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate.

According to yet another embodiment of the present disclosure, provided is a non-transitory computer-readable recording medium storing a program that causes a computer to perform a process that forms a thin film on a substrate by performing a cycle a predetermined number of times. The cycle includes supplying a source gas to the substrate inside a processing chamber of a substrate processing apparatus, and supplying excited species to the substrate inside the processing chamber from each of a plurality of excitation units provided at a side of the substrate, the excited species being generated by plasma-exciting a reaction gas in each of the plurality of excitation units. Further, in supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate.

According to the present disclosure in some embodiments, provided are the method of manufacturing a semiconductor device, the method of processing a substrate, the substrate processing apparatus, and the recording medium, which can enhance processing uniformity in a substrate plane when processing the substrate by using excited species which are generated by plasma-exciting a reaction gas.

BRIEF DESCRIPTION OF THE DRAWINGS

FIG. 12A is a sectional plan schematically illustrating a configuration of a vertical processing furnace of a substrate processing apparatus, in which four buffer chambers are provided, suitable for use in another embodiment of the present disclosure.

DETAILED DESCRIPTION

As described above, when a substrate is processed using excited a species obtained by plasma-exciting a reaction gas, in-plane uniformity of the substrate processing, specifically, in-plane film-thickness uniformity or film-quality uniformity of a thin film formed on the substrate may be deteriorated.

The inventors have researched for methods for enhancing the processing uniformity in a substrate plane when a substrate is processed using excited species generated by plasma-exciting a reaction gas. As a result, the inventors discovered that the above problem can be solved when "a thin film is formed by performing a cycle a predetermined number of times, in which the cycle includes a process of supplying a source gas to a substrate and a process of supplying excited species to the substrate from each of a plurality of excitation units. In this case, each of the plurality of excitation units provided at a side of the substrate generates the excited species by plasma-exciting a reaction gas. Further, in supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate."

Moreover, the inventors discovered that although a plasma output in each of the excitation units is low, the amount of the excited species supplied to the substrate can be increased by "supplying, to the substrate, excited species generated by plasma-exciting reaction gases in the plurality of excitation units." Further, the inventors know that plasma damages to a substrate or members in a processing chamber can be prevented, the efficiency of substrate processing can be increased, and a processing time can be shortened. Furthermore, the inventors also know that a thin film having a very low impurity concentration can be formed by efficiently separating impurities such as chlorine from the thin film formed on a substrate.

The present disclosure is provided based on the above knowledge which the inventors have obtained. Hereinafter, embodiments of the present disclosure will be described in detail with reference to the drawings.

Figure 1:
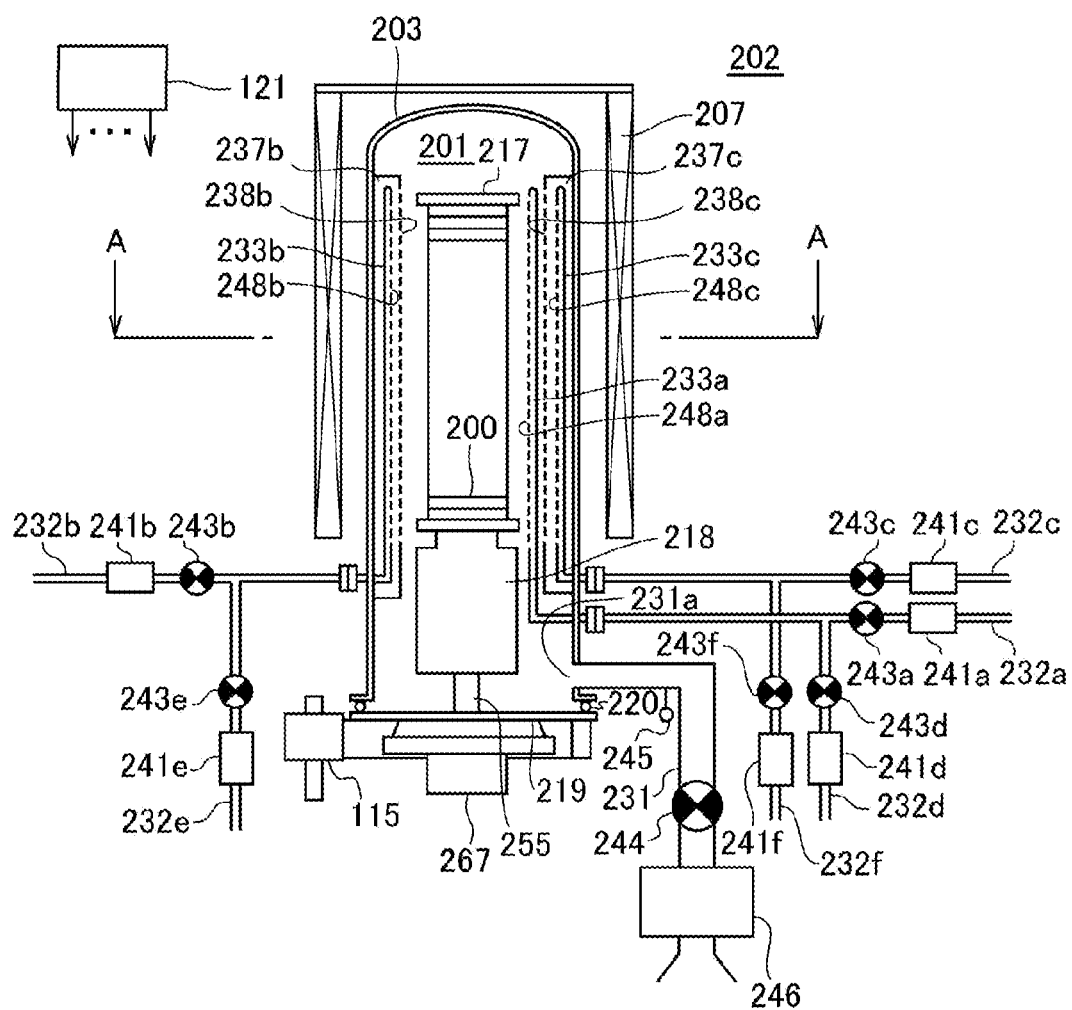
FIG. 1 is a vertical sectional view schematically illustrating a configuration of a vertical processing furnace of a substrate processing apparatus suitable for use in an embodiment of the present disclosure.
Figure 2:
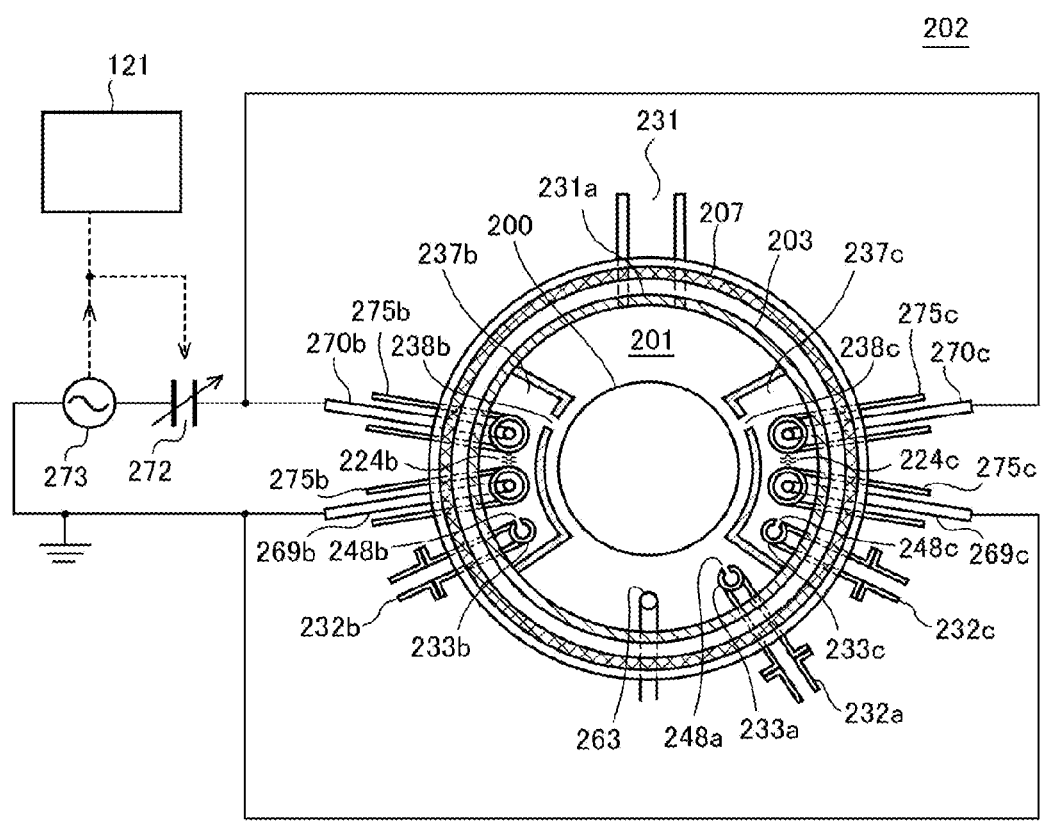
FIG. 2 is a cross sectional view, which is taken along the line A-A of FIG. 1, schematically illustrating a configuration of the vertical processing furnace of the substrate processing apparatus suitable for use in an embodiment of the present disclosure.

Embodiments of Present Disclosure (1) Configuration of Substrate Processing Apparatus FIG. 1 is a vertical sectional view schematically illustrating a configuration of a vertical processing furnace 202 of a substrate processing apparatus suitable for use in the embodiment. Further, FIG. 2 is a cross sectional view, which is taken along the line A-A of FIG. 1, schematically illustrating a configuration of the vertical processing furnace 202 of the substrate processing apparatus suitable for use in the embodiment.

As illustrated in FIG. 1, the processing furnace 202 includes a heater 207 as heating means (heating unit). A heater base (not shown) serving as a support plate supports the heater 207, which may have a cylindrical shape and may be vertically fixed and disposed. Further, the heater 207 may act as an activation unit (an excitation part) that activates (excites) gas with heat, as will be described below.

A reaction tube 203 is disposed inside of the heater 207, and configured to connect a reaction vessel (processing vessel) concentric with the heater 207. The reaction tube 203, for example, may be formed of a heat-resistant material such as quartz ($SiO_2$) or silicon carbide (SiC) and in a cylindrical shape in which its upper end is closed while its lower end is opened. A processing chamber 201 is formed in a cylindrical hollow portion of the reaction tube 203 and configured to accommodate a plurality of substrates, i.e., wafers 200, vertically aligned in a horizontal posture and in multiple stages by a boat 217, which will be described below.

A first nozzle 233a serving as a first gas introduction part, a second nozzle 233b serving as a second gas introduction part, and a third nozzle 233c serving as a third gas introduction part are disposed to pass through a lower side wall of the reaction tube 203, in the processing chamber 201. A first gas supply pipe 232a is connected to the first nozzle 233a, a second gas supply pipe 232b is connected to the second nozzle 233b, and a third gas supply pipe 232c is connected to the third nozzle 233c. In this case, the three nozzles 233a to 233c and the three gas supply pipes 232a to 232c are disposed in the reaction tube 203 so that a plurality of types of gases, for example, two types of gases, can be supplied into the processing chamber 201.

Moreover, a metal manifold supporting the reaction tube 203 may be disposed at a lower portion of the reaction tube 203, and each of the nozzles may be disposed to pass through a side wall of the metal manifold. In this case, an exhaust pipe 231 may also be disposed in the metal manifold, which will be described below. Further, the exhaust pipe 231 may also be disposed under the reaction tube 203 instead of the metal manifold. In this way, a furnace opening portion of the processing furnace 202 may be formed of a metal, and the nozzles or the like may be disposed in the furnace opening portion formed of the metal.

In the first gas supply pipe 232a, a mass flow controller (MFC) 241a serving as a flow rate controller (flow rate control unit) and a valve 243a serving as an opening/closing valve are disposed sequentially from an upstream side. In addition, a first inert gas supply pipe 232d is connected to the first gas supply pipe 232a at a more downstream side than the valve 243a. In the first inert gas supply pipe 232d, a mass flow controller 241d serving as a flow rate controller (flow rate control unit) and a valve 243d serving as an opening/closing valve are disposed sequentially from an upstream side. Further, the above described first nozzle 233a is connected to a front end portion of the first gas supply pipe 232a. In an arc-shaped space between an inner wall of the reaction tube 203 and the wafers 200, the first nozzle 233a is disposed to ascend toward an upper portion of the plurality of the wafers 200 in a stacking direction and along an upper portion from a lower portion of an inner wall of the reaction tube 203. In other words, the first nozzle 233a is disposed at the side of a wafer arrangement area in which the wafers 200 are arranged, in an area that horizontally surrounds the wafer arrangement area, and along the wafer arrangement area. The first nozzle 233a includes an L-shaped long nozzle, a horizontal portion of the first nozzle 233a is disposed to pass through the lower side wall of the reaction tube 203, and a vertical portion of the first nozzle 233a is disposed to at least ascend in a direction from one end portion to the other end portion of the wafer arrangement area. A gas supply hole 248a for supplying gas is disposed at a side surface of the first nozzle 233a. The gas supply hole 248a is opened toward the center of the reaction tube 203 to supply gas toward the wafers 200. A plurality of the gas supply holes 248a is disposed over from a lower portion to an upper portion of the reaction tube 203. The plurality of gas supply holes 248a may have the same opening area, and is disposed at the same opening pitch.

In the second gas supply pipe 232b, a mass flow controller (MFC) 241b serving as a flow rate controller (flow rate control unit) and a valve 243b serving as an opening/closing valve are disposed sequentially from an upstream side. In addition, a second inert gas supply pipe 232e is connected to the second gas supply pipe 232b at a more downstream side than the valve 243b. In the second inert gas supply pipe 232e, a mass flow controller 241e serving as a flow rate controller (flow rate control unit) and a valve 243e serving as an opening/closing valve are disposed sequentially from an upstream side. Further, the above described second nozzle 233b is connected to a front end portion of the second gas supply pipe 232b. The second nozzle 233b is disposed within a buffer chamber 237b serving as a gas diffusion space.

The buffer chamber 237b is disposed along the stacking direction of the wafers 200, in an arc-shaped space between the inner wall of the reaction tube 203 and the wafers 200, and in a portion over from the lower portion to the upper portion of the inner wall of the reaction tube 203. That is, the buffer chamber 237b is disposed at the side of the wafer arrangement area and in an area that horizontally surrounds the wafer arrangement area, and along the wafer arrangement area. A gas supply hole 238b for supplying gas is disposed at an end portion of a wall of the buffer chamber 237b adjacent to the wafers 200. The gas supply hole 238b is opened toward the center of the reaction tube 203 to supply the gas toward the wafers 200. A plurality of the gas supply holes 238b is disposed over from the lower portion to the upper portion of the reaction tube 203. The plurality of gas supply holes 238b may have the same opening area and is disposed at the same opening pitch.

The second nozzle 233b is disposed at an end portion opposed to an end portion in which the gas supply holes 238b of the buffer chamber 237b are disposed so that the second nozzle 233b ascends toward the upper portion of the wafers 200 in the stacking direction and along the upper portion from the lower portion of the inner wall of the reaction tube 203. In other words, the second nozzle 233b is disposed at the side of wafer arrangement area, in an area that horizontally surrounds the wafer arrangement area, and along the wafer arrangement area. The second nozzle 233b includes an L-shaped long nozzle, a horizontal portion of the second nozzle 233b is disposed to pass through the lower side wall of the reaction tube 203, and a vertical portion of the second nozzle 233b is disposed to at least ascend in a direction from one end portion to the other end portion of the wafer arrangement area. A gas supply hole 248b for supplying gas is disposed at a side surface of the second nozzle 233b. The gas supply hole 248b is opened toward the center of the buffer chamber 237b. Similar to the gas supply holes 238b of the buffer chamber 237b, a plurality of the gas supply holes 248b is disposed over from the lower portion to the upper portion of the reaction tube 203. When a pressure difference between the inside of the buffer chamber 237b and the inside of the processing chamber 201 is small, it may be configured for the plurality of gas supply holes 248b to have a constant opening area and a constant opening pitch from an upstream side (lower portion) to a downstream side (upper portion). On the other hand, when the pressure difference is large, the opening area may become larger or the opening pitch may become smaller in a direction from the upstream side to the downstream side.

In the embodiment, as described above, by adjusting the opening area or the opening pitch of the respective gas supply holes 248b of the second nozzle 233b over from the upstream side to the downstream side, gases are flown out from the respective gas supply holes 248b at an almost constant flow rate although a flow velocity difference occurs between the gas supply holes 248b. The gases from the respective gas supply holes 248b are first introduced into the buffer chamber 237b and the flow velocity difference between the gases gets uniform in the buffer chamber 237b. That is, particle velocities of the gases flown out from the respective gas supply holes 248b of the second nozzle 233b into the buffer chamber 237b are buffered in the buffer chamber 237b, and then flown out from the respective gas supply holes 238b of the buffer chamber 237b into the processing chamber 201. As such, the gases flown out from the respective gas supply holes 248b of the second nozzle 233b into the buffer chamber 237b have a substantially uniform flow rate and a substantially uniform flow velocity when the gases are flown out from the respective gas supply holes 238b of the buffer chamber 237b into the processing chamber 201.

In the third gas supply pipe 232c, a mass flow controller (MFC) 241c serving as a flow rate controller (flow rate control unit) and a valve 243c serving as an opening/closing valve are disposed sequentially from an upstream side. In addition, a third inert gas supply pipe 232f is connected to the third gas supply pipe 232c at a more downstream side than the valve 243c. In the third inert gas supply pipe 232f, a mass flow controller 241f serving as a flow rate controller (flow rate control unit) and a valve 243f serving as an opening/closing valve are disposed sequentially from an upstream side. Further, the above described third nozzle 233c is connected to a front end portion of the third gas supply pipe 232c. The third nozzle 233c is disposed in a buffer chamber 237c serving as a gas diffusion space.

The buffer chamber 237c is disposed along the stacking direction of the wafers 200, in an arc-shaped space between the inner wall of the reaction tube 203 and the wafers 200, and in a portion over from the lower portion to the upper portion of the inner wall of the reaction tube 203. That is, the buffer chamber 237c is disposed at the side of the wafer arrangement area, in an area that horizontally surrounds the wafer arrangement area, and along the wafer arrangement area. A gas supply hole 238c for supplying gas is disposed at an end portion of a wall of the buffer chamber 237c adjacent to the wafer 200. The gas supply hole 238c is opened toward the center of the reaction tube 203 to supply gas toward the wafers 200. A plurality of the gas supply holes 238c is disposed over from the lower portion to the upper portion of the reaction tube 203. The plurality of gas supply holes 238c may have the same opening area and is disposed at the same opening pitch.

The third nozzle 233c is disposed at an end portion opposed to an end portion in which the gas supply holes 238c of the buffer chamber 237c are disposed so that the third nozzle 233c ascends toward the upper portion of the wafers 200 in the stacking direction and along the upper portion from the lower portion of the inner wall of the reaction tube 203. In other words, the third nozzle 233c is disposed at the side of the wafer arrangement area, in an area that horizontally surrounds the wafer arrangement area, and along the wafer arrangement area. The third nozzle 233c includes an L-shaped long nozzle, a horizontal portion of the third nozzle 233c is disposed to pass through the lower side wall of the reaction tube 203, and a vertical portion of the third nozzle 233c is disposed to at least ascend in a direction from one end portion to the other end portion of the wafer arrangement area. A gas supply hole 248c for supplying gas is disposed at a side surface of the third nozzle 233c. The gas supply hole 248c is opened toward the center of the buffer chamber 237c. Similar to the gas supply holes 238c of the buffer chamber 237c, a plurality of the gas supply holes 248c is disposed over from the lower portion to the upper portion of the reaction tube 203. When a pressure difference between the inside of the buffer chamber 237c and the inside of the processing chamber 201 is small, it may be configured for the plurality of gas supply holes 248c to have a constant opening area and a constant opening pitch from an upstream side (lower portion) to a downstream side (upper portion). On the other hand, when the pressure difference is large, the opening area may become larger or the opening pitch may become smaller in a direction from the upstream side to the downstream side.

In the embodiment, as described above, by adjusting the opening area or the opening pitch of the respective gas supply holes 248c of the third nozzle 233c over from the upstream side to the downstream side, gases are flown out from the respective gas supply holes 248c at an almost constant flow rate although a flow velocity difference occurs between the gas supply holes 248c. The gases flown out from the respective gas supply holes 248c are first introduced into the buffer chamber 237c and the flow velocity difference between the gases gets uniform in the buffer chamber 237c. That is, particle velocities of the gases flown out from the respective gas supply holes 248c of the third nozzle 233c into the buffer chamber 237c are buffered in the buffer chamber 237c, and then flown out from the respective gas supply holes 238c of the buffer chamber 237c into the processing chamber 201. As such, the gases flown out from the respective gas supply holes 248c of the third nozzle 233c into the buffer chamber 237c have a substantially uniform flow rate and a substantially uniform flow velocity when the gases are flown out from the respective gas supply holes 238c of the buffer chamber 237c into the processing chamber 201.

As described above, the gas supply method according to the embodiment transfers gases via the nozzles 233a to 233c and the buffer chambers 237b and 237c, which are disposed in the arc-shaped vertical long space defined by the inner wall of the reaction tube 203 and the end portions of the plurality of stacked wafers 200, and first discharges the gases from the gas supply holes 248a, 248b, 248c, 238b, and 238c (which are respectively opened in the nozzles 233a to 233c and the buffer chambers 237b and 237c) into the reaction tube 203 near the wafers 200 so that the directions of main gas flows in the reaction tube 203 becomes parallel to surfaces of the wafers 200 (i.e., horizontal direction). According to such a configuration, the gas can be uniformly supplied to the wafers 200, thereby making a film thickness of a thin film formed in each of the wafers 200 uniform. Further, the gas flowing on a surface of the wafer 200, that is, a residual gas after reaction flows toward an exhaust port, such as an exhaust pipe 231 which will be described below. However, the flow direction of the residual gas may be appropriately specified depending on a position of the exhaust port, and is not limited to a vertical direction.

Moreover, the two buffer chambers 237b and 237c are disposed to face each other with the center of the wafers 200 (i.e., the center of the reaction tube 203) placed between the buffer chambers 237b and 237c. Specifically, when viewed from a plane as illustrated in FIG. 2, the two buffer chambers 237b and 237c are disposed to be axisymmetric about a straight line (used as a target axis) that connects the center of the wafer 200 and the center of an exhaust port 231a, which will be described later, disposed at a side wall of the reaction tube 203. The gas supply hole 238b of the buffer chamber 237b, the gas supply hole 238c of the buffer chamber 237c, and the exhaust port 231a are disposed such that lines connecting the respective centers of the gas supply hole 238b, the gas supply hole 238c, and the exhaust port 231a form an isosceles triangle. Therefore, gas streams flowing from the two buffer chambers 237b and 237c to the wafer 200 become uniform. That is, the gas streams flowing from the two buffer chambers 237b and 237c to the wafer 200 are axisymmetric about the straight line (used as the target axis) that connects the center of the wafer 200 and the center of the exhaust port 231a.

As a source gas containing a certain element such as a source gas (silicon-containing gas) containing silicon (Si) as the certain element, for example, monochlorosilane (SiH$_3$Cl, abbreviated to MCS) that is a type of chlorosilane-based source gas, may be supplied from the first gas supply pipe 232a into the processing chamber 201 through the mass flow controller 241a, the valve 243a, and the first nozzle 233a. At this point, an inert gas may be simultaneously supplied from the first inert gas supply pipe 232d into the first gas supply pipe 232a through the mass flow controller 241d and the valve 243d. Further, the chlorosilane-based source gas may be the gas which is obtained by vaporizing a gaseous chlorosilane-based source, for example, a liquid chlorosilane-based source, under normal temperature and normal pressure, or may be a gaseous chlorosilane-based source under normal temperature and normal pressure. Specifically, the chlorosilane-based source refers to a silane-based source having a chloro group as a halogen group, and is a source that at least includes silicon (Si) and chlorine (Cl). That is, the chlorosilane-based source described herein may be a type of halide. Furthermore, in the specification of the present disclosure, the term "source" may denote "a liquid source in a liquid state", "a gaseous source in gas," or both the liquid source and the gaseous source. Therefore, in the specification, the term "chlorosilane-based source" may denote "a liquid chlorosilane-based source," "a gaseous chlorosilane-based source," or both the liquid chlorosilane-based source and the gaseous chlorosilane-based source.

Gas containing nitrogen (nitrogen-containing gas), namely, a nitriding gas such as ammonia (NH$_3$) gas is supplied as a reaction gas from the second gas supply pipe 232b into the processing chamber 201 through the mass flow controller 241b, the valve 243b, the second nozzle 233b, and the buffer chamber 237b. At this point, an inert gas may be simultaneously supplied from the second inert gas supply pipe 232e into the second gas supply pipe 232b through the mass flow controller 241e and the valve 243e.

Gas containing nitrogen (nitrogen-containing gas), namely, a nitriding gas such as ammonia (NH$_3$) gas is supplied as a reaction gas from the third gas supply pipe 232c into the processing chamber 201 through the mass flow controller 241c, the valve 243c, the third nozzle 233c, and the buffer chamber 237c. At this point, an inert gas may be simultaneously supplied from the third inert gas supply pipe 232f into the third gas supply pipe 232c through the mass flow controller 241f and the valve 243f.

In a case that gas flows from the first gas supply pipe 232a as described above, a first gas supply system (source gas supply system) for supplying the source gas (MCS gas) into the processing chamber 201, namely, a silicon-containing gas supply system (MCS gas supply system), mainly includes the first gas supply pipe 232a, the mass flow controller 241a, and the valve 243a. Further, it may be considered that the first gas supply system includes the first nozzle 233a. In addition, a first inert gas supply system mainly includes the first inert gas supply pipe 232d, the mass flow controller 241d, and the valve 243d. The first inert gas supply system may also act as a purge gas supply system.

On the other hand, in a case that gases flow from the second gas supply pipe 232b and the third gas supply pipe 232c as described above, a second gas supply system (reaction gas supply system) for supplying a nitrogen-containing gas (NH$_3$ gas) as a reaction gas to respective excitation units, namely, a nitrogen-containing gas supply system (NH$_3$ gas supply system), which will be described below, mainly includes the second gas supply pipe 232b, the third gas supply pipe 232c, the mass flow controllers 241b and 241c, and the valves 243b and 243c. Further, it may be considered that the second gas supply system includes the second nozzle 233b, the third nozzle 233c, and the buffer chambers 237b and 237c. Also, a second inert gas supply system mainly includes the second inert gas supply pipe 232e, the third inert gas supply pipe 232f, the mass flow controllers 241e and 241f, and the valves 243e and 243f. The second inert gas supply system may also act as a purge gas supply system. Furthermore, a reaction gas supply system mainly includes the second gas supply pipe 232b, the mass flow controller 241b, and the valve 243b, and may be referred to as a first reaction gas supply system (first nitrogen-containing gas supply system). Further, another reaction gas supply system mainly includes the third gas supply pipe 232c, the mass flow controller 241c, and the valve 243c, and may be referred to as a second reaction gas supply system (second nitrogen-containing gas supply system).

In the buffer chamber 237b, as illustrated in FIG. 2, a first rod-shaped electrode 269b serving as a first electrode having a slender and long structure and a second rod-shaped electrode 270b serving as a second electrode having a slender and long structure are disposed along the stacking direction of the wafers 200 over from the lower portion to the upper portion of the reaction tube 203. Each of the first rod-shaped electrode 269b and second rod-shaped electrode 270b is disposed parallel to the second nozzle 233b. Each of the first rod-shaped electrode 269b and second rod-shaped electrode 270b is covered and protected by an electrode protection tube 275b serving as a protection tube for protecting the respective electrodes over from an upper portion to a lower portion thereof. One of the first rod-shaped electrode 269b and second rod-shaped electrode 270b is connected to a high-frequency power source 273 through a matching unit 272, and the other is connected to the ground corresponding to a reference electric potential. By applying a high-frequency power from the high-frequency power source 273 between the first rod-shaped electrode 269b and the second rod-shaped electrode 270b through the matching unit 272, a plasma is generated in a plasma generation area 224b between the first rod-shaped electrode 269b and the second rod-shaped electrode 270b.

Likewise, a first rod-shaped electrode 269c serving as a first electrode having slender and long structure and is and a second rod-shaped electrode 270c serving as a second electrode having a slender and long structure are disposed along the stacking direction of the wafers 200 over from the lower portion to the upper portion of the reaction tube 203, in the buffer chamber 237b. Each of the first rod-shaped electrode 269c and second rod-shaped electrode 270c is disposed parallel to the third nozzle 233c. Each of the first rod-shaped electrode 269c and second rod-shaped electrode 270c is covered and protected by an electrode protection tube 275c serving as a protection tube for protecting respective electrodes over from an upper portion to a lower portion thereof. One of the first rod-shaped electrode 269c and second rod-shaped electrode 270c is connected to a high-frequency power source 273 through the matching unit 272, and the other is connected to the ground corresponding to a reference electric potential. By applying high-frequency power from the high-frequency power source 273 between the first rod-shaped electrode 269c and the second rod-shaped electrode 270c through the matching unit 272, a plasma is generated in a plasma generation area 224c between the first rod-shaped electrode 269c and the second rod-shaped electrode 270c.

A first plasma source serving as a plasma generator (plasma generation unit) mainly include the first rod-shaped electrode 269b, the second rod-shaped electrode 270b, and the electrode protection tube 275b. Further, it may be considered that the matching unit 272 and the high-frequency power source 273 are included in the first plasma source. On the other hand, a second plasma source serving as a plasma generator (plasma generation unit) mainly include the first rod-shaped electrode 269c, the second rod-shaped electrode 270c, and the electrode protection tube 275c. Furthermore, it may be considered that the matching unit 272 and the high-frequency power source 273 are included in the second plasma source. In addition, as will be described below, each of the first plasma source and second plasma source acts as an excitation unit (activation unit) that excites (activates) gas to a plasma. Also, it may be considered that the excitation part includes the buffer chambers 237b and 237c. Like this, the two excitation units are disposed in the substrate processing apparatus according to the embodiment, while a suitable plural number of excitation units may be provided. Furthermore, the plurality of excitation units is dispersedly disposed. The first plasma source may be referred to as a first excitation unit, and the second plasma source may be referred to as a second excitation unit. Also, it may be considered that the buffer chamber 237b is included in the first excitation unit and the buffer chamber 237c is included in the second excitation unit.

The electrode protection tubes 275b and 275c have a structure to respectively insert the first rod-shaped electrodes 269b and 269c and the second rod-shaped electrodes 270b and 270c into the buffer chambers 237b and 237c in a state where the first rod-shaped electrodes 269b and 269c and the second rod-shaped electrodes 270b and 270c are respectively isolated from the atmosphere inside the buffer chambers 237b and 237c. Here, if an internal oxygen concentration of each of the electrode protection tubes 275b and 275c is substantially equal to an oxygen concentration in the air (atmosphere), the first rod-shaped electrodes 269b and 269c and the second rod-shaped electrodes 270b and 270c respectively inserted into the electrode protection tubes 275b and 275c will be oxidized with the heat generated by the heater 207. Therefore, by charging the insides of the electrode protection tubes 275b and 275c with an inert gas such as nitrogen gas, or by purging the insides of the electrode protection tubes 275b and 275c with an inert gas such as nitrogen gas using an inert gas purge unit, the internal oxygen concentration in the respective electrode protection tubes 275b and 275c can be decreased, thus preventing the oxidation of the first rod-shaped electrodes 269b and 269c or the second rod-shaped electrodes 270b and 270c.

The above described exhaust port 231a is disposed in the reaction tube 203. The exhaust pipe 231 for exhausting atmosphere inside the processing chamber 201 is connected to the exhaust port 231a. A vacuum pump 246 serving as a vacuum exhaust unit is connected to the exhaust pipe 231 through a pressure sensor 245 serving as a pressure detector (pressure detection unit) for detecting a pressure inside the processing chamber 201 and an auto pressure controller (APC) valve 244 serving as a pressure regulator (pressure regulation unit). Further, when the vacuum pump 246 is operating, the APC valve 244 may vacuum-exhaust the inside of the processing chamber 201 and stop the vacuum-exhaust by opening and closing the APC valve 244. Furthermore, when the vacuum pump 246 is operating, the APC valve 244 may regulate a pressure inside the processing chamber 201 by adjusting a degree of valve opening. An exhaust system mainly includes the exhaust pipe 231, the APC valve 244, and the pressure sensor 245. Further, it may be considered that the vacuum pump 246 is included in the exhaust system. The exhaust system may adjust the degree of valve opening of the APC valve 244 on the basis of pressure information detected by the pressure sensor 245 while operating the vacuum pump 246, thereby vacuum-exhausting the inside of the processing chamber 201 such that a pressure inside the processing chamber 201 reaches a certain pressure (degree of vacuum).

A seal cap 219 is disposed as a furnace opening cover for closely sealing a lower end opening of the reaction tube 203, under the reaction tube 203. The seal cap 219 contacts the lower end of the reaction tube 203 from a vertical lower side. The seal cap 219 may be formed of metal, for example, stainless or the like, and in a disc shape. An O-ring 220 contacting the lower end of the reaction tube 203 is disposed as a seal member at a top of the seal cap 219. A rotation unit 267 that rotates the boat 217 is disposed as a substrate retention support, which will be described below, on the opposite side of the processing chamber 201 with respect to the seal cap 219. A rotation axis 255 of the rotation unit 267 is connected to the boat 217 through the seal cap 219. The rotation unit 267 rotates the boat 217 to rotate the wafers 200. The seal cap 219 is configured to be moved up and down by a boat elevator 115 serving as an ascending/descending unit, vertically disposed outside the reaction tube 203. By moving up and down the seal cap 219, the boat elevator 115 may load and unload the boat 217 into and from the processing chamber 201. That is, the boat elevator 115 includes a transfer device (transfer unit) that transfers the boat 217, namely, the wafers 200, to the inside and from the outside of the processing chamber 201.

The boat 217 as a substrate support unit may be formed of a heat-resistant material, for example, quartz, silicon carbide or the like, and align the plurality of wafers 200 in a state where the wafers 200 are arranged in a horizontal posture to have a uniform center, thereby supporting the plurality of wafers 200 in multiple stages. Further, a heat insulating member 218 formed of a heat-resistant material, for example, quartz, silicon carbide, or the like, may be disposed under the boat 217, and may prevent heat from the heater 207 from being transferred to the side of the seal cap 219. Furthermore, the heat insulating member 218 may include a plurality of heat insulating plates formed of a heat-resistant material such as quartz, silicon carbide, or the like, and a heat insulating plate holder that supports the heat insulating plates in a horizontal posture and in multiple stages.

A temperature sensor 263 is disposed as a temperature detector in the reaction tube 203. Therefore, by regulating an electric power supply to the heater 207 on the basis of temperature information detected by the temperature sensor 263, the inside of the processing chamber 201 has a desired temperature distribution. Similar to the first nozzle 233a, the temperature sensor 263 may be of an L-shape and disposed along the inner wall of the reaction tube 203.

Figure 3:
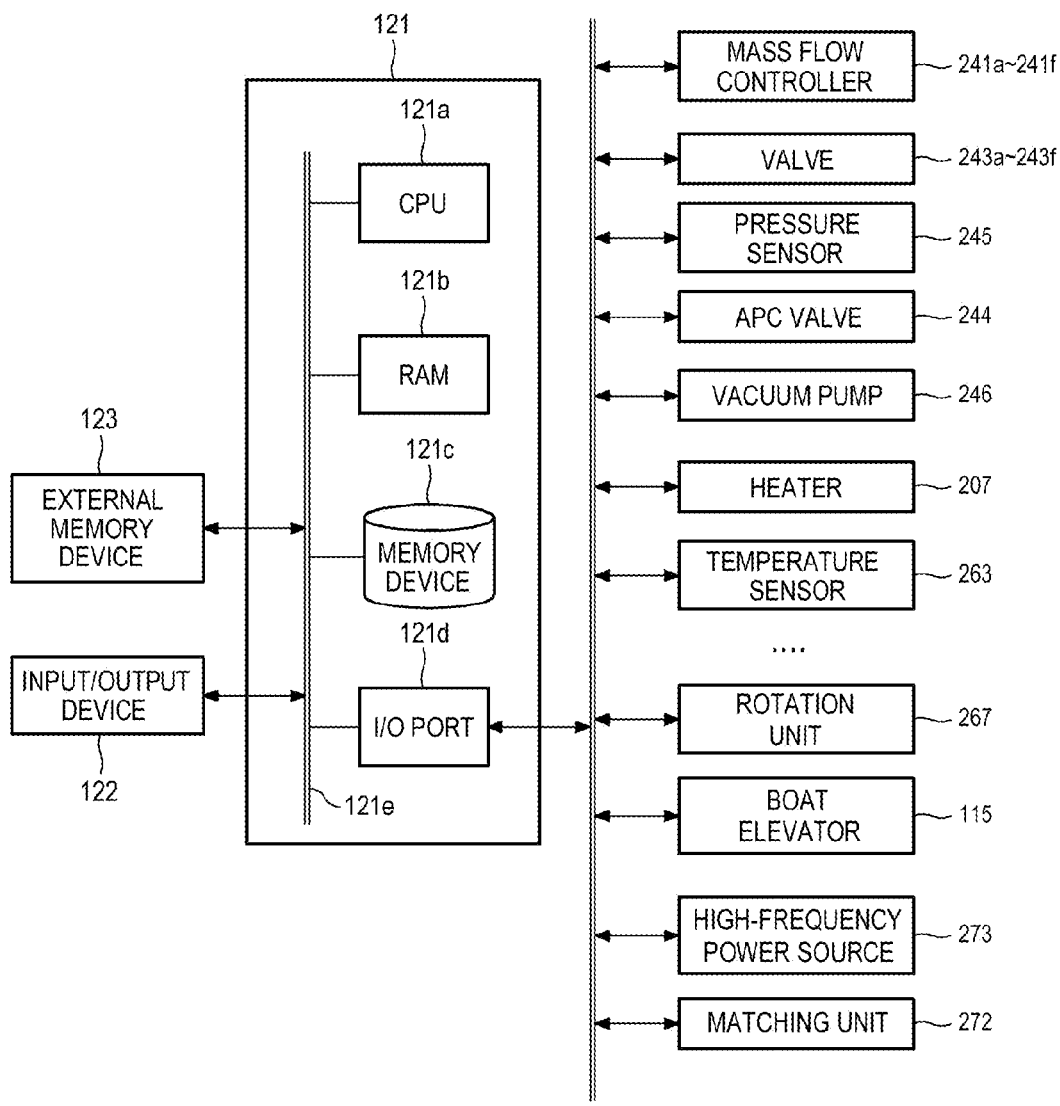
FIG. 3 is a diagram schematically illustrating a configuration of a controller of a substrate processing apparatus suitable for use in an embodiment of the present disclosure, specifically, a block diagram illustrating a control system of the controller.

As illustrated in FIG. 3, a controller 121 serving as a control unit (control means) includes a computer equipped with a central processing unit (CPU) 121a, a random access memory (RAM) 121b, a memory device 121c, and an input/output (I/O) port 121d. The RAM 121b, the memory device 121c, and the I/O port 121d may exchange data with the CPU 121a through an internal bus 121e. An input/output device 122, for example, a touch panel or the like may be connected to the controller 121.

The memory device 121c may include, for example, a flash memory, a hard disk drive (HDD), or the like. A control program for controlling the operation of the substrate processing apparatus, a process recipe describing a substrate processing sequence or condition which will be described below, and the like are readably stored in the memory device 121c. Further, such a process recipe is used for obtaining a certain result by executing each sequence of substrate processing process by the controller 121, which will be described below, and acts as a program. Hereinafter, the process recipe or the control program is simply referred to as a program. Further, in the specification of the present disclosure, the term "program" may include a process recipe group, a control program group, or both the process recipe group and the control program group. Also, the RAM 121b has a memory area (work area) in which a program or data read by the CPU 121a is temporarily stored.

The I/O port 121d is connected to the above described mass flow controllers 241a to 241f, the valves 243a to 243f, the pressure sensor 245, the APC valve 244, the vacuum pump 246, the heater 207, the temperature sensor 263, the rotation unit 267, the boat elevator 115, the high-frequency power source 273, and the matching unit 272.

The CPU 121a reads the control program from the memory device 121c to execute the read control program, and also reads the process recipe from the memory device 121c according to a manipulation command input from the input/output device 122. Furthermore, the CPU 121a controls a flow rate regulating operation of various gases performed by each of the mass flow controllers 241a to 241f, an opening/closing operation of each of the valves 243a to 243f, an opening/closing operation of the APC valve 244, a pressure regulating operation performed by the APC valve 244 based on the pressure sensor 245, a temperature regulating operation performed by the heater 207 based on the temperature sensor 263, start and stop of the vacuum pump 246, a rotating operation and a rotation speed adjusting operation of the boat 217 performed by the rotation unit 267, an ascending/descending control of the boat 217 performed by the boat elevator 115, a control of power supply by the high-frequency power source 273, and an impedance regulating operation performed by the matching unit 272, according to details of the read process recipe.

Moreover, the controller 121 is not limited to being configured with a dedicated computer, and, as another example, the controller 121 may be configured a general computer. For example, the controller 221 according to an embodiment of the present disclosure may be configured by preparing an external memory device 123 (for example, a magnetic tape, a magnetic disk such as a flexible disk or a hard disk, an optical disk such as a CD or a DVD, a magneto-optical disk such as an MO, or a semiconductor memory such as a USB memory or a memory card) that stores the above described program is prepared, and installing the program in a general computer using the relevant external memory device 123. Further, means for supplying a program to a computer is not limited to a case that provides the program through the external memory device 123. For example, a program may be provided using a communication means such as the Internet or a dedicated line, without using the external memory device 123. Furthermore, the memory device 121c or the external memory device 123 is configured with a computer-readable recording medium. Hereinafter, each of the storage elements is simply referred to as a recording medium. Also, in the specification, the term "recording medium" may include the memory device 121c group, include the external memory device 123 group, or include both the memory device 121c group and the external memory device 123 group.

(2) Substrate Processing Process

An example of a method that forms a nitride film serving as an insulating film and thin film on a substrate using the processing furnace 202 of the above described substrate processing apparatus will be described below as one of the process of manufacturing semiconductor apparatus (device). Further, operations of respective elements configuring the substrate processing apparatus are controlled by the controller 121.

Figure 4:
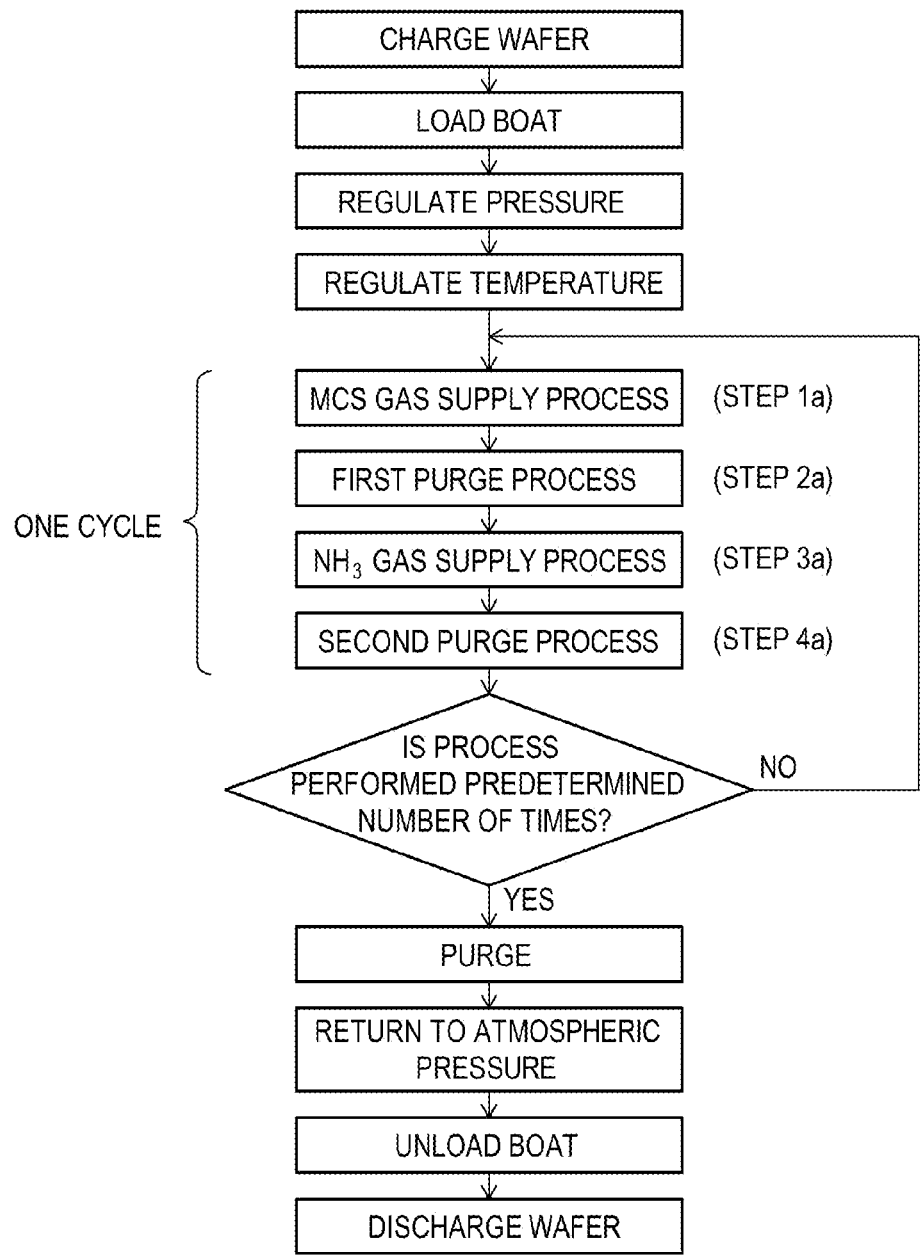
FIG. 4 is a diagram illustrating a film forming flow according to an embodiment of the present disclosure.
Figure 5:
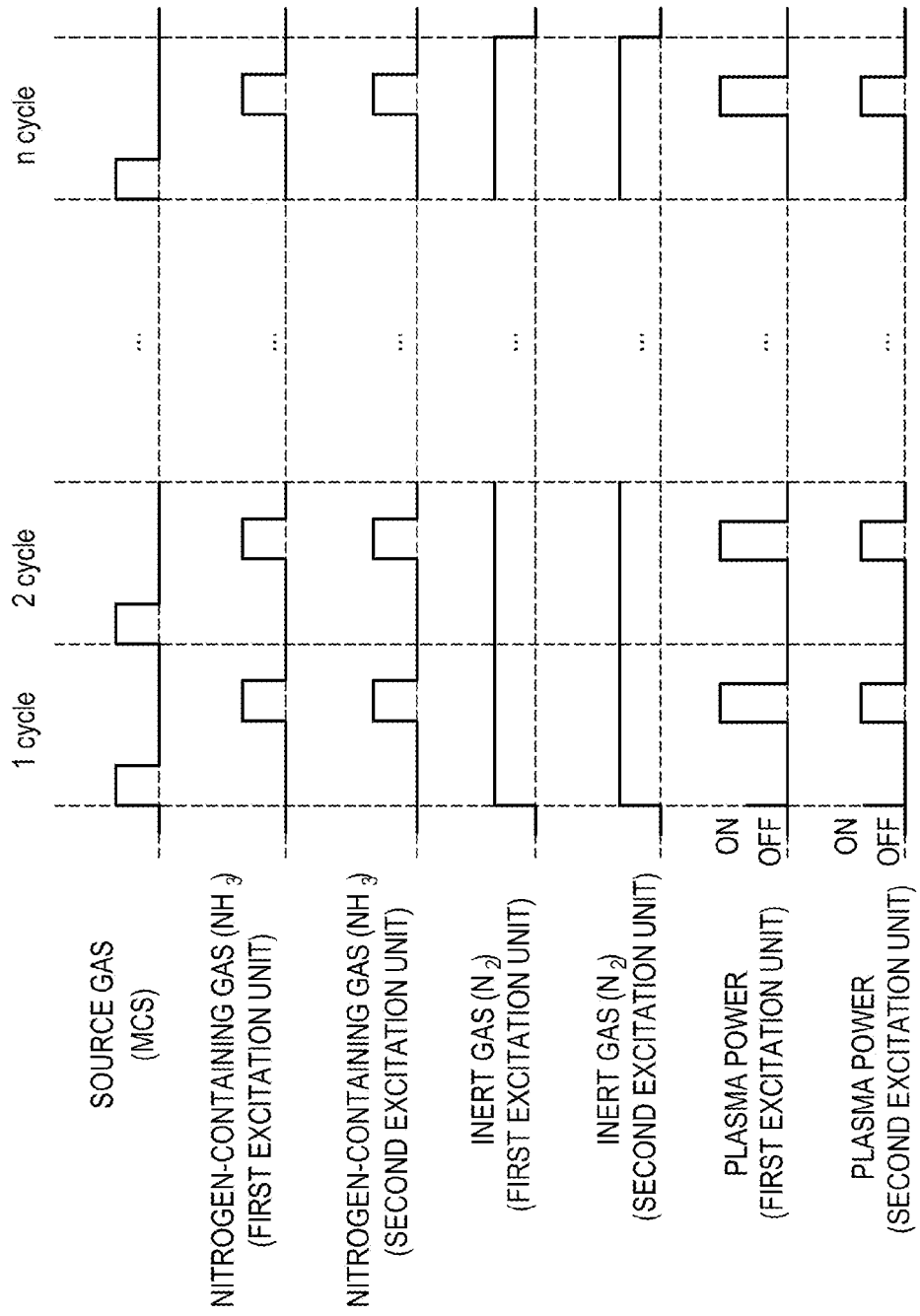
FIG. 5 is a diagram showing an example of gas supply and plasma power supply timings in a film forming sequence according to an embodiment of the present disclosure.

FIG. 4 is a diagram illustrating a film forming flow in an embodiment of the present disclosure. FIG. 5 is a diagram showing an example of a gas supply and plasma supply timings in a film forming sequence in the embodiment of the present disclosure.

In a film forming sequence according to the embodiment, a process in which a silicon-containing layer on the wafer 200 supplies a source gas to the wafer 200 inside the processing chamber 201, and a process in which a plurality of excitation units provided at a side of the wafer 200 plasma-excites a nitrogen-containing gas as a reaction gas to generate excited species, supplies the excited species to the wafer 200 inside the processing chamber 201 to nitride the silicon-containing layer, and changes the silicon-containing layer to a silicon nitride layer, are performed a predetermined number of times so that a silicon nitride film having a predetermined film thickness is formed on the wafer 200.

In a process of supplying the excited species from the respective excitation units, the in-plane distribution of excited species supplied from at least one of the plurality of excitation units in the wafer 200 differs from the in-plane distribution of another excited species supplied from another excitation unit, other than the at least one excitation unit, among the plurality of excitation units, in the wafer 200. Specifically, herein, among the plurality of excitation units, the in-plane distribution of the excited species supplied from one of a pair of excitation units in the wafer 200 differs from the in-plane distribution of the other excited species supplied from the other excitation unit in the wafer 200. In more detail, the in-plane distribution of the excited species supplied from the first excitation unit in the wafer 200 differs from the in-plane distribution of the other excited species supplied from the second excitation unit in the wafer 200.

A detailed description on this will be made below. Also, a description of the embodiment will now be made on an example in which a silicon nitride film ($Si_3N_4$ film, hereinafter simply referred to as a SiN film) as an insulating film is formed on the wafer 200 by the film forming flow of FIG. 4 and the film forming sequence of FIG. 5, using MCS gas as a source gas and $NH_3$ gas as a nitrogen-containing gas.

Moreover, in the specification, the term "wafer" may denote "a wafer itself," or "a stack (set) including a wafer and a certain layer, film, or the like formed on a surface of the wafer (i.e., a case in which the wafer is referred to as including the certain layer, film, or the like formed on the surface of the wafer)." Further, in the specification, the term "surface of wafer" may denote "a surface (exposed surface) of a wafer itself" or "a surface (i.e., the outermost surface of a wafer that is a stack) of a certain layer, film, or the like formed on the wafer."

Therefore, in the specification, the description of "a certain gas is supplied to a wafer" may denote that "a certain gas is directly supplied to a surface (exposed surface) of a wafer itself" or "a certain gas is supplied to a layer, film, or the like formed on a wafer, namely, to the outermost surface of the wafer which is a stack." Further, in the specification, description of "a certain layer (or film) is formed on a wafer" may denote that a certain layer (or film) is directly formed on a surface (exposed surface) of a wafer itself" or that "a certain layer (or film) is formed on a layer, film, or the like formed on a wafer, namely, on the outermost surface of the wafer which is a stack."

Moreover, in the specification, similar to the use of the term "wafer," the use of the term "substrate" can be understood by replacing the term "wafer" with the term "substrate" in the above description.

(Charge of Wafer and Load of Boat)

When the plurality of wafers 200 is loaded on the boat 217 (charge of wafer), as illustrated in FIG. 1, the boat 217 supporting the plurality of wafers 200 is lifted by the boat elevator 115 and transferred into the processing chamber 201 (load of boat). In this state, the seal cap 219 seals the lower end portion of the reaction tube 203 through the O-ring 220.

(Regulation of Pressure and Regulation of Temperature)

The inside of the processing chamber 201 is vacuum-exhausted by the vacuum pump 246 to have a desired pressure (degree of vacuum). At this point, a pressure inside the processing chamber 201 is measured by the pressure sensor 245, and the APC valve 244 is feedback-controlled (regulation of pressure) on the basis of the measured pressure information. Further, the vacuum pump 246 maintains a continuous operating state until the processing of the wafer 200 is ended at least. Furthermore, the inside of the processing chamber 201 is heated by the heater 207 to have a desired temperature. At this point, an electric power supply to the heater 207 is feedback-controlled (regulation of temperature) on the basis of temperature information detected by the temperature sensor 263, in order for the inside of the processing chamber 201 to have a desired temperature distribution. Moreover, the heater 207 continuously heats the inside of the processing chamber 201 until the processing of the wafer 200 is completed. Subsequently, the rotation unit 267 starts to rotate the boat 217 and the wafer 200. Also, the boat 217 and the wafer 200 are continuously rotated by the rotation unit 267 until the processing of the wafer 200 is completed.

(Process of Forming Silicon Nitride Film)

Next, four steps, namely, steps 1a to 4a which will be described below are sequentially performed.

[Step 1a]

By opening the valve 243a of the first gas supply pipe 232a and the valve 243d of the first inert gas supply pipe 232d, the MCS gas flows to the first gas supply pipe 232a, and the $N_2$ gas flows to the first inert gas supply pipe 232d. The $N_2$ gas flows from the first inert gas supply pipe 232d, and a flow rate of the $N_2$ gas is regulated by the mass flow controller 241d. The MCS gas flows from the first gas supply pipe 232a, and a flow rate of the MCS gas is regulated by the mass flow controller 241a. The flow rate-regulated MCS gas is mixed with the flow rate-regulated $N_2$ gas inside the first gas supply pipe 232a, supplied from the gas supply holes 248a of the first nozzle 233a into the processing chamber 201 having the heated and depressurized state, and exhausted from the exhaust pipe 231. At this point, the MCS gas is supplied to the wafer 200 (supply of MCS gas).

At this point, also, in order to prevent the MCS gas from penetrating into the second nozzle 233b, the third nozzle 233c, and the buffer chambers 237b and 237c, the valves 243e and 243f are opened and $N_2$ gas flows into the second inert gas supply pipe 232e and the third inert gas supply pipe 232f. The $N_2$ gas is supplied into the processing chamber 201 through the second and third gas supply pipes 232b and 232c, the second and third nozzles 233b and 233c, and the buffer chambers 237b and 237c, and exhausted from the exhaust pipe 231.

At this point, by suitably regulating the APC valve 244, a pressure inside the processing chamber 201 may be within, for example, a range of 10 to 1,000 Pa. A supply flow rate of the MCS gas controlled by the mass flow controller 241a may be within, for example, a range of 100 to 2,000 sccm (0.1 to 2 slm). A supply flow rate of the $N_2$ gas controlled by the mass flow controllers 241d to 241f may be within, for example, a range of 100 to 2,000 sccm (0.1 to 2 slm). The duration of time in exposing the MCS gas to the wafer 200 may be within, for example, a range of 1 to 120 sec. The temperature of the heater 207 is set as a temperature at which a chemical deposition reaction is performed in the processing chamber 201 in the above described pressure range. That is, the temperature of the heater 207 is set as a temperature that allows the temperature of the wafer 200 to become a constant temperature within, for example, a range of 250 to 630° C., and preferably, a range of 300 to 500° C.

Moreover, when the temperature of the wafer 200 is less than 300° C., it becomes difficult to decompose and adsorb the MCS gas in the wafer 200, and thus, a depositing rate may be reduced. Especially, when the temperature of the wafer 200 is less than 250° C., even if the MCS gas is adsorbed and decomposed on the wafer 200, a difference occurs in each of a decomposed amount and an adsorbed amount depending on an in-plane position of the wafer 200 or the position of the wafer 200, and thus, the MCS gas is not uniformly decomposed and adsorbed over the plane of the wafer 200 or from the wafer 200 to the wafer 200. Also, in this temperature range, the desorption reaction of chlorine becomes difficult to be performed, and thus, the dissociation of a Si—Cl bond or the desorption of Cl that prevents the formation of a Si—N bond in step 3a, which will be described below, is obstructed, causing a decrease in a film density. Such limitations can be overcome by raising the temperature of the wafer 200 to higher than 250° C., and moreover, by raising the temperature of the wafer 200 to higher than 300° C., it becomes possible to prevent a depositing rate from being reduced.

Moreover, when the temperature of the wafer 200 is greater than 550° C., a vaporization reaction becomes dominant, and particularly, when the temperature of the wafer 200 is greater than 630° C., the film-thickness uniformity becomes easily deteriorated, whereby it becomes difficult to control the film-thickness uniformity. By lowering the temperature of the wafer 200 less than 630° C., the deterioration of film-thickness uniformity can be prevented, and thus, it becomes possible to control the film-thickness uniformity. Further, by lowering the temperature of the wafer 200 less than 550° C., a state can be avoided in which the vaporization reaction becomes dominant, and particularly, by lowering the temperature of the wafer 200 less than 500° C., a surface reaction becomes dominant, it becomes easy to secure film-thickness uniformity, whereby it becomes easy to control the film-thickness uniformity. Also, when the temperature of the wafer 200 is greater than 630° C., the desorption reaction of chlorine become conspicuous, the amount of residual chlorine decreases. On the other hand, in a low temperature region equal to or less than 630° C., although the desorption reaction of chlorine is not performed, the amount of residual chlorine increases compared to a high temperature region, and thus, the method according to the embodiment becomes more significant.

In this regard, the temperature of the wafer 200 may be within a range of 250 to 630° C. inclusive, and preferably, 300 to 500° C. inclusive.

Under the above described condition, namely, a condition in which a chemical deposition reaction is performed, by supplying the MCS gas into the processing chamber 201, a silicon-containing layer having a thickness equal to a range from less than one atomic layer to several atomic layers is formed on the wafer 200 (base film of a surface). The silicon-containing layer may be an adsorption layer of the MCS gas, may be a silicon layer (Si layer), or may include both the adsorption layer of the MCS gas and the silicon layer. However, the silicon-containing layer may preferably include silicon (Si) and chlorine (Cl).

Here, the silicon layer may include a discontinuous layer as well as a continuous layer formed of silicon (Si), and include a silicon thin film that is formed by overlapping the discontinuous layer with the continuous layer. Further, the continuous layer formed of Si may be called a silicon thin film. Furthermore, Si forming the silicon layer includes Si for which a bond with Cl or H is not completely broken.

Moreover, the adsorption layer of the MCS gas includes a discontinuous chemical adsorption layer as well as a continuous chemical adsorption layer of gas molecules of the MCS gas. That is, the adsorption layer of the MCS gas includes one molecular layer formed of MCS molecules or a chemical adsorption layer having a thickness of one molecular layer or less. Further, MCS molecules ($SiH_3Cl$) forming the adsorption layer of the MCS gas include molecules ($SiH_x$ molecules or $SiH_xCl$ molecules) in which a Si—Cl bond or a Si—H bond is partially broken. That is, the adsorption layer of the MCS gas includes a continuous chemical adsorption layer or discontinuous chemical adsorption layer of $SiH_3Cl$ molecules and/or $SiH_x$ molecules and/or $SiH_xCl$ molecules. Also, a layer having a thickness less than one atomic layer denotes a discontinuously formed atomic layer, and a layer having a thickness of one atomic layer denotes a continuously formed atomic layer. Also, a layer having a thickness less than one molecular layer denotes a discontinuously formed molecular layer, and a layer having a thickness of one molecular layer denotes a continuously formed molecular layer.

Si is deposited on the wafer 200 to form a silicon layer under a condition in which the self-decomposition (thermal decomposition) of the MCS gas occurs, namely, the thermal decomposition reaction of the MCS gas occurs. The MCS gas is adsorbed onto the wafer 200 to form an adsorption layer of the MCS gas under a condition in which the self-decomposition (thermal decomposition) of the MCS gas does not occurs, namely, the thermal decomposition reaction of the MCS gas does not occur. Further, a film forming rate is greater in a case of forming the silicon layer on the wafer 200 than a case of forming the adsorption layer of the MCS gas on the wafer 200, and thus, it is preferable to form the silicon layer on the wafer 200.

When the thickness of the silicon-containing layer formed on the wafer 200 is greater than several atomic layers, it becomes difficult to perform nitridation or desorption of chlorine in step 3a, which will be described below, to affect the entire silicon-containing layer. In addition, the minimum value of the thickness of the silicon-containing layer which can be formed on the wafer 200 is less than one atomic layer. As such, the thickness of the silicon-containing layer may be preferably between less than one atomic layer and several atomic layers. Also, when the thickness of the silicon-containing layer is equal to or less than one atomic layer, the process of nitridation or desorption of chlorine in step 3a, which will be described below, can relatively increase, and, a time necessary for the nitridation reaction of step 3a can be shortened. A time necessary for forming the silicon-containing layer in step 1a may be shortened. As a result, a processing time per one cycle can be shortened, and thus, a total processing time can be shortened. That is to say, it becomes possible to increase a film forming rate. Also, by setting the thickness of the silicon-containing layer to one atomic layer or less, it becomes possible to increase the controllability of the film-thickness uniformity.

Moreover, in step 1a, the amount of chlorine supplied into the processing chamber 201 can be reduced by using the MCS gas in which a chlorine (Cl)-containing rate is low and surface-adsorbing capability is high. The MCS gas has a small number of Cl atoms in a composition formula, namely, has a small amount of chlorine per 1 mole compared to dichlorosilane ($SiH_2Cl_2$, abbreviated to DCS) or hexachlorodisilane ($Si_2Cl_6$, abbreviated to HCDS), and thus, the amount of chlorine supplied into the processing chamber 201 in step 1a can be reduced. Therefore, a ratio of chlorine bonding with a silicon-containing layer (adsorption layer of MCS gas or silicon layer), namely, the number of Si—Cl bonds can be reduced, and thus, a silicon-containing layer having a low chlorine concentration is formed. As a result, in step 3a, a silicon nitride layer having a low chlorine concentration is formed.

Moreover, by reducing the number of Si—Cl bonds in a silicon-containing layer, the number of Si—H bonds in the silicon-containing layer can increase. The Si—Cl bond has bond energy greater than the Si—H bond, and thus obstructs the formation of a Si—N bond in step 3a, namely, the nitridation of the silicon-containing layer. On the other hand, the Si—H bond has bond energy lower than the Si—Cl bond, and thus facilitates the formation of the Si—N bond in step 3a, namely, the nitridation of the silicon-containing layer.

That is, by forming the silicon nitride layer that has a low chlorine concentration such that the number of Si—Cl bonds is small, factors that obstruct the nitridation of the silicon-containing layer can be reduced, thus facilitating the nitridation of the silicon-containing layer in step 3a. Also, by increasing the number of Si—H bonds in the silicon-containing layer, factors that facilitate the nitridation of the silicon-containing layer can increase, thus further facilitating the nitridation of the silicon-containing layer in step 3a. Accordingly, it becomes possible to increase the nitridation efficiency of the silicon-containing layer in step 3a, and a nitridation time is shortened, thus shortening a processing time.

A source gas containing silicon may use a chlorosilane-based source gas such as hexachlorodisilane ($Si_2Cl_6$, abbreviated to HCDS) gas, tetrachlorosilane gas (i.e., silicon tetra chloride ($SiCl_4$, abbreviated to STC) gas), trichlorosilane (Si-HCl_3, abbreviated to TCS) gas, dichlorosilane ($SiH_2Cl_2$, abbreviated to DCS) gas or the like, an inorganic source gas such as trisilane ($Si_3H_8$, abbreviated to TS) gas, disilane ($Si_2H_6$, abbreviated to DS) gas, or monosilane ($SiH_4$, abbreviated to MS) gas, or an organic source gas such as aminosilane-based tetrakis(dimethylamino)silane ($Si[N(CH_3)_2]_4$, abbreviated to 4DMAS) gas, tris(dimethylamino)silane (Si

[N(CH$_3$)$_2$]$_3$H, abbreviated to 3DMAS) gas, bis(diethylamino)silane (Si[N(C$_2$H$_5$)$_2$]$_2$H$_2$, abbreviated to 2DEAS) gas, or bis tertiary butyl amino silane (SiH$_2$[NH(C$_4$H$_9$)]$_2$, abbreviated to BTBAS) gas, in addition to the monochlorosilane (SiH$_3$Cl, abbreviated to MCS) gas. However, when a chlorosilane-based source gas containing chlorine (Cl) is used, a source gas having a small number of Cl atoms in the composition formula (In one molecule) is preferably used, the MCS gas may be more preferably used. An inert gas may use rare gases, such as Ar, He, Ne, Xe gas, or the like, as well as N$_2$ gas.

[Step 2a]

A silicon-containing layer is formed on the wafer 200, and then, the supply of the MCS gas is stopped by closing the valve 243a of the first gas supply pipe 232a. At this point, by opening the APC valve 244 of the exhaust pipe 231, the inside of the processing chamber 201 is vacuum-exhausted by the vacuum pump 246, and the MCS gas which has not reacted to be left in the processing chamber 201 or has contributed to form the silicon-containing layer is removed from the inside of the processing chamber 201. At this point, also, by opening the valves 243d to 243f, the supply of the N$_2$ gas as an inert gas into the processing chamber 201 is maintained. The N$_2$ gas acts as a purge gas, and thus, the effect that the MCS gas (which has not reacted to be left in the processing chamber 201 or has contributed to form the silicon-containing layer) is removed from the inside of the processing chamber 201 can be enhanced (first purge process).

At this point, moreover, the gas left in the processing chamber 201 may not completely be removed, and the inside of the processing chamber 201 may not completely be purged. When the amount of gas left in the processing chamber 201 is small, a bad influence does not occur in subsequently performed step 3a. In this case, a flow rate of the N$_2$ gas supplied into the processing chamber 201 does not require a high flow rate, and for example, by supplying an amount of gas equal to the volume of the reaction tube 203 (processing chamber 201), purging may be performed to a degree where it does not adversely affect the process in step 3a. Like this, since the inside of the processing chamber 201 is not completely purged, a purging time can be shortened, and thus, a throughput can be enhanced. Also, it becomes possible to minimize the consumption of the N$_2$ gas.

In this case, the temperature of the heater 207 is set in order for the temperature of the wafer 200 to be a constant temperature within a range of 250 to 630° C., preferably, 300 to 500° C., identical to the case of supplying the MCS gas. A supply flow rate of the N$_2$ gas as a purge gas may be within, for example, a range of 100 to 2,000 sccm (0.1 to 2 slm). The purge gas may use rare gases, such as Ar, He, Ne, Xe gas, or the like as well as N$_2$ gas.

[Step 3a]

A residual gas inside the processing chamber 201 is removed, and then, two excitation units (plasma generation units) disposed by the side of the wafer 200 excite the NH$_3$ gas to plasma, and supply the plasma-excited NH$_3$ gas (i.e., excited species generated by plasma-exciting the NH$_3$ gas) to the wafer 200 inside the processing chamber 201 (NH$_3$ gas supply process).

That is, by opening the valve 243b of the second gas supply pipe 232b, an NH$_3$ gas flows in the second gas supply pipe 232b. The NH$_3$ gas flowing in the second gas supply pipe 232b is regulated in flow rate by the mass flow controller 241b. The flow rate-regulated NH$_3$ gas is supplied from the gas supply holes 248b of the second nozzle 233b into the buffer chamber 237b. At this point, by applying high-frequency power from the high-frequency power source 273 between the first rod-shaped electrode 269b and the second rod-shaped electrode 270b through the matching unit 272, the NH$_3$ gas supplied into the buffer chamber 237b is plasma-excited. Then, the plasma-excited NH$_3$ gas is supplied as excited species (i.e., activated species (NH$_3$*)) from the gas supply holes 238b into the processing chamber 201, and exhausted from the exhaust pipe 231. At this point, the plasma-excited NH$_3$ gas is supplied to the wafer 200. Further, by opening the valve 243e, the N$_2$ gas flows in the second inert gas supply pipe 232e. Both the N$_2$ gas and the NH$_3$ gas are supplied into the processing chamber 201, and exhausted from the exhaust pipe 231.

Furthermore, by opening the valve 243c of the third gas supply pipe 232c, the NH$_3$ gas flows in the third gas supply pipe 232c. The NH$_3$ gas flowing in the third gas supply pipe 232c is regulated in flow rate by the mass flow controller 241c. The flow rate-regulated NH$_3$ gas is supplied from the gas supply holes 248c of the third nozzle 233c into the buffer chamber 237c. At this point, by applying high-frequency power from the high-frequency power source 273 between the first rod-shaped electrode 269c and the second rod-shaped electrode 270c through the matching unit 272, the NH$_3$ gas supplied into the buffer chamber 237c is plasma-excited. Then, the plasma-excited NH$_3$ gas is supplied as excited species (i.e., activated species (NH$_3$*)) from the gas supply holes 238c into the processing chamber 201, and exhausted from the exhaust pipe 231. At this point, the plasma-excited NH$_3$ gas is supplied to the wafer 200. In addition, by opening the valve 243f, the N$_2$ gas flows in the third inert gas supply pipe 232f. Both the N$_2$ gas and the NH$_3$ gas are supplied into the processing chamber 201, and exhausted from the exhaust pipe 231.

Moreover, in order to prevent the penetration of the NH$_3$ gas into the first nozzle 233a, by opening the valve 243d, the N$_2$ gas flows in the first inert gas supply pipe 232d. The N$_2$ gas is supplied into the processing chamber 201 through the first gas supply pipe 232a and the first nozzle 233a, and exhausted from the exhaust pipe 231.

When the NH$_3$ gas is plasma-excited and the plasma-excited NH$_3$ gas as excited species is supplied, a pressure inside the processing chamber 201 may be within, for example, a range of 10 to 1,000 Pa by appropriately regulating the APC valve 244. Supply flow rates of the NH$_3$ gases controlled by the respective mass flow controllers 241b and 241c may be within, for example, a range of 1,000 to 10,000 sccm (1 to 10 slm). Supply flow rates of the N$_2$ gases controlled by the respective mass flow controllers 241e, 241f, and 241d may be within, for example, a range of 100 to 2,000 sccm (0.1 to 2 slm). A time (i.e., gas supply time (irradiation time)), taken in supplying the plasma-excited NH$_3$ gas (i.e., excited species which are generated by plasma-exciting the NH$_3$ gas) to the wafer 200, may be within, for example, a range of 1 to 120 sec. Considering a throughput, the temperature of the heater 207 is set as a temperature at which a silicon-containing layer is nitrided, and may be set as the same temperature range as supplying the MCS gas in step 1a, namely, in order for a temperature inside the processing chamber 201 to maintain the same temperature range in step 1a and step 3a. In this case, the temperature of the heater 207 may be set such that the temperature of the wafer 200 in step 1a and step 3a, namely, the temperature inside the processing chamber 201 is within a range of 250 to 630° C., and preferably a constant temperature within a range of 300 to 500° C. Furthermore, the temperature of the heater 207 may be set such that the temperature inside the processing chamber 201 maintains the same temperature range in step 1a to step 4a (described below). The high-frequency power applied from the high-frequency power source 273 between the first rod-shaped electrodes 269a and 269c and the second rod-shaped electrodes 270b and 270c may be set to be within, for example, a range of 50 to 1,000 W. In this case, the $NH_3$ gas may be heat-excited, namely, activated with heat, and supplied. However, when the $NH_3$ gas is thermally activated and flows under a depressurized atmosphere, a pressure inside the processing chamber 201 may be set as a relatively higher pressure range, for example, a pressure within a range of 10 to 3,000 Pa, and further, it is required to set the temperature of the wafer 200 greater than 550° C., to obtain sufficient nitriding capability. On the other hand, when the $NH_3$ gas is plasma-excited and flows, the sufficient nitriding capability can be obtained by setting the temperature inside the processing chamber 201 greater than 250° C. Also, when the $NH_3$ gas is plasma-excited and flows, even if the temperature inside the processing chamber 201 is set as a normal temperature, the sufficient nitriding capability may be obtained. However, when the temperature inside the processing chamber 201 is less than 150° C., a reaction byproduct such as ammonium chloride ($NH_4Cl$) is adhered to the inside of the processing chamber 201 or the wafer 200. For this reason, the temperature inside the processing chamber 201 may be set greater than 150° C., preferably. In the embodiment, the temperature inside the processing chamber 201 may be greater than 250° C.

By supplying the $NH_3$ gas into the processing chamber 201 under the above described condition, the $NH_3$ gas is plasma-excited, and thus, $NH_3$ gas ($NH_3$*) changed to excited species reacts with at least a portion of a silicon-containing layer formed on the wafer 200. Therefore, nitridation processing is performed on the silicon-containing layer, and, the silicon-containing layer is changed (modified) to a silicon nitride layer ($Si_3N_4$ layer, hereinafter simply referred to as a SiN layer) by the nitridation processing.

Moreover, in step 3a, by using the plurality of plasma generation units (excitation units), respective high-frequency powers applied to the plasma generation units (excitation units) can be reduced, and thus, a plasma output from each of the plasma generation units (excitation units) can be lowered, while the amount of the excited species supplied to the wafer 200 can be increased. Accordingly, it becomes possible to prevent the plasma damage of the wafer 200 or silicon-containing layer, while the amount of the excited species supplied to the wafer 200 is increased.

Therefore, in this case, the plasma damage of the wafer 200 or silicon-containing layer is prevented, the amount of excited species supplied to the wafer 200 is increased, and the nitriding capability becomes greater. Accordingly, the nitridation of the silicon-containing layer is facilitated. That is, it becomes possible to enhance the nitridation efficiency. Furthermore, a quick shift up to a self-limiting state (completely nitrided state), as the nitridation of the silicon-containing layer is saturated, may be achieved, thereby saving a nitridation time. As a result, a shortened processing time may be achieved. Also, the in-plane uniformity of nitridation processing in the wafer 200 can be enhanced. That is, it becomes possible to more uniformly supply the excited species to the in-plane entire area of the wafer 200, and for example, a noticeable difference in a degree of nitridation can be prevented between the vicinity of an outer circumference of the wafer 200 and the central axis of the wafer 200.

Moreover, chlorine contained in the silicon-containing layer having a low chlorine concentration which has been formed in step 1a may be efficiently desorbed by using the plurality of plasma generation units, where the plasma damage of the wafer 200 or silicon-containing layer is prevented, and the amount of the excited species supplied to the wafer 200 increases. Accordingly, the silicon-containing layer having a low chlorine concentration is formed. Also, as chlorine is efficiently desorbed, the nitridation efficiency may be enhanced. That is, since the chlorine that obstructs nitridation is efficiently desorbed from the silicon-containing layer, the nitridation efficiency can be enhanced. Also, chlorine desorbed from the silicon-containing layer is exhausted from the exhaust pipe 231 to the outside of the processing chamber 201.

Moreover, in step 3a, the distribution balance in the wafer 200 plane of the excited species supplied from the plurality of excitation units (plasma generation units) is controlled. That is, the in-plane distribution of the excited species supplied from at least one of the plurality of excitation units (plasma generation units) in the wafer 200 differs from the in-plane distribution of the excited species supplied from another excitation unit other than the at least one excitation unit among the plurality of excitation units in the wafer 200.

For example, the in-plane distribution of the excited species supplied from at least one of the plurality of excitation units (plasma generation units) in the wafer 200 may be a distribution in which the excited species reach the central portion of the wafer 200, and the in-plane distribution of the excited species supplied from another excitation unit may be a distribution in which the excited species reach a portion other than the central portion of the wafer 200. For example, the in-plane distribution of excited species supplied from at least one of the plurality of excitation units (plasma generation units) in the wafer 200 may be a distribution in which the excited species reach the central portion of the wafer 200, and the in-plane distribution of the excited species supplied from another excitation unit may be a distribution in which the excited species reach a peripheral portion of the wafer 200.

Specifically, the in-plane distribution of the excited species supplied from a first excitation unit in the wafer 200 differs from the in-plane distribution of the excited species supplied from a second excitation unit.

Figure 10A:
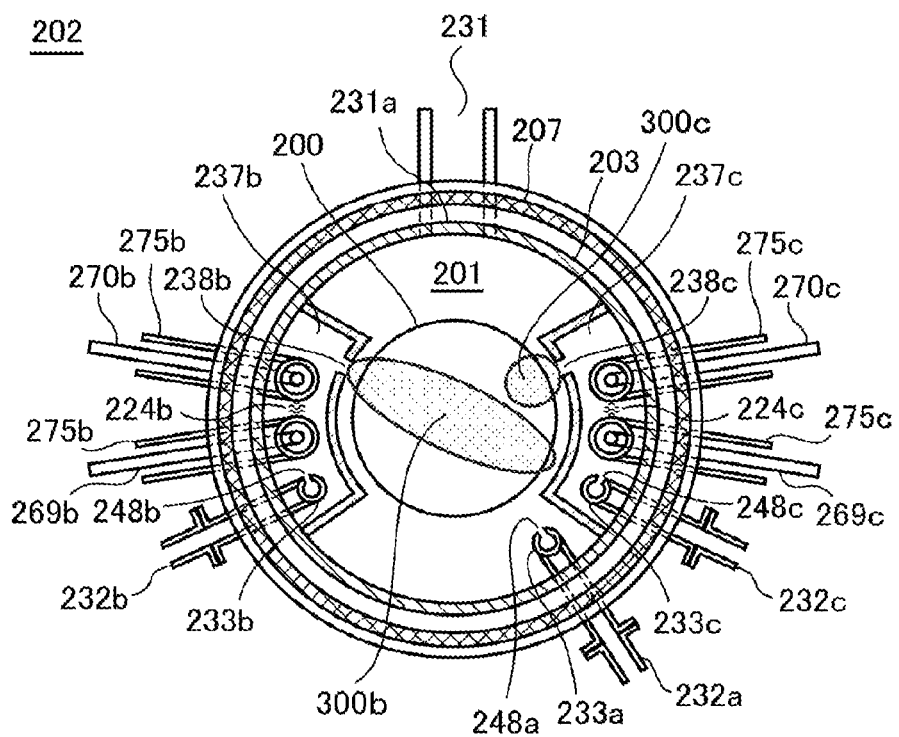
FIG. 10A depicts an example of operation that controls distribution balance in a substrate plane of excited species supplied from a plurality of buffer chambers.

For example, as illustrated in FIG. 10A, the in-plane distribution of the excited species supplied from the first excitation unit, i.e., the buffer chamber 237b, in the wafer 200 may be a wide distribution in which the excited species deviate from the central portion of the wafer 200 and reaches a peripheral portion on the opposite side of the wafer 200. On the other hand, the in-plane distribution of the excited species supplied from the second excitation unit, i.e., the buffer chamber 237c in the wafer 200 may be a distribution in which the excited species reach only the peripheral portion of the wafer 200 and is narrowly distributed at the side of the gas supply hole 238c. Further, reference numeral "300b" indicates the in-plane distribution area of the excited species supplied from the buffer chamber 237b in the wafer 200, while reference numeral "300c" indicates the in-plane distribution area of the excited species supplied from each of the buffer chamber 237c in the wafer 200. In this case, the excited species are supplied to a total of three portions in the peripheral portion of the wafer 200 (two portions in the distribution indicated by reference numeral "300b" and one portion in the distribution indicated by reference numeral "300c"), while the excited species are supplied to one portion in the central portion of the wafer 200 (one portion in the distribution indicated by reference numeral "300b").

Figure 10B:
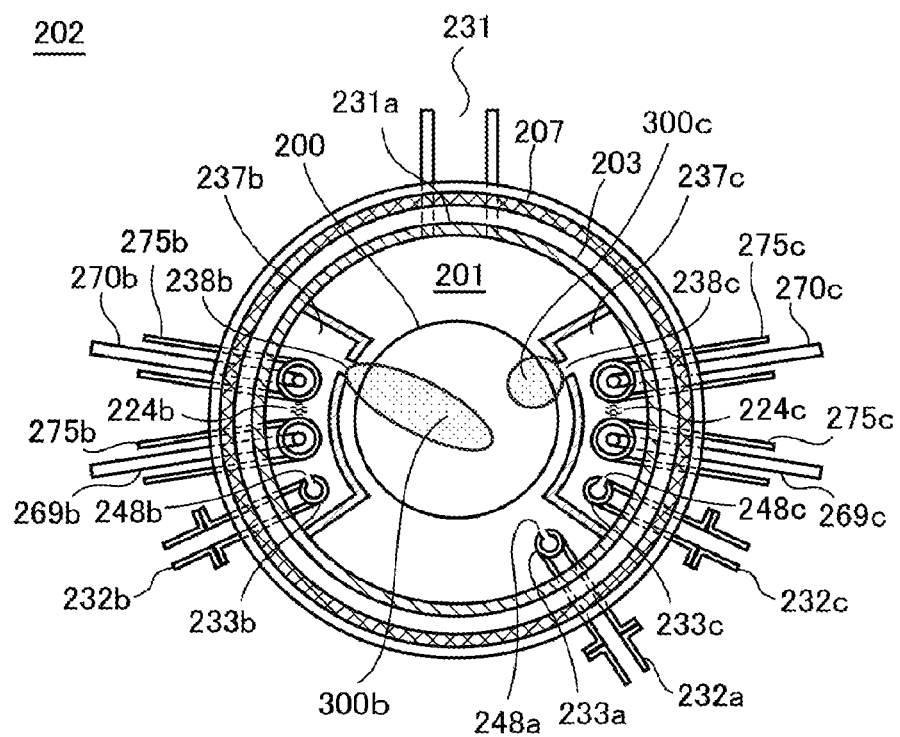
FIG. 10B depicts a modified example of operation that controls distribution balance in a substrate plane of excited species supplied from a plurality of buffer chambers.

On the other hand, for example, as illustrated in FIG. 10B, the in-plane distribution of the excited species supplied from the first excitation unit, i.e., the buffer chamber 237b in the wafer 200 may be a distribution in which the excited species reach the central portion of the wafer 200 and does not reach the peripheral portion on the opposite side of the wafer 200. On the other hand, the in-plane distribution of the excited species supplied from the second excitation unit, i.e., the buffer chamber 237c in the wafer 200 may be a distribution in which the excited species reach only the peripheral portion of the wafer 200 and is narrowly distributed at the side of the gas supply hole 238c. In this case, the excited species are supplied to a total of two portions in the peripheral portion of the wafer 200 (one portion in the distribution indicated by reference numeral "300b" and one portion in the distribution indicated by reference numeral "300c"), and the excited species are supplied to one in the central portion of the wafer 200 portion (one portion in the distribution indicated by reference numeral "300b").

When the in-plane distribution of excited species in the wafer 200 is set as illustrated in FIG. 10A, it becomes easier to facilitate nitridation processing or modification processing (removal processing of impurities such as chlorine, etc.) in a peripheral portion in comparison to a central portion of the wafer 200 than a case in which the in-plane distribution of excited species in the wafer 200 is set as illustrated in FIG. 10B. On the other hand, when the in-plane distribution of excited species in the wafer 200 is set as illustrated in FIG. 10B, it becomes easier to facilitate nitridation processing or modification processing in the central portion in comparison to the peripheral portion of the wafer 200 than a case in which the in-plane distribution of excited species in the wafer 200 is set as illustrated in FIG. 10A. Therefore, when desiring to relatively facilitate nitridation processing or modification processing of the silicon-containing layer in the peripheral portion in comparison to the central portion of the wafer 200, the in-plane distribution of excited species in the wafer 200 may be set as illustrated in FIG. 10A. On the other hand, when desiring to relatively facilitate nitridation processing or modification processing of the silicon-containing layer in the central portion in comparison to the peripheral portion of the wafer 200, the in-plane distribution of excited species in the wafer 200 may be set as illustrated in FIG. 10B. Like this, by differently setting the in-plane distribution of the excited species supplied from the first excitation unit in the wafer 200 and the in-plane distribution of the excited species supplied from the second excitation unit in the wafer 200, specifically, by controlling the balance (balance of the number of supplied portions) of a distribution, it becomes possible to enhance the in-plane film-quality uniformity and film-thickness uniformity of a silicon nitride film in the wafer 200.

Moreover, by controlling the in-plane distribution balance of excited species in the wafer 200, and also, by controlling a ratio of the nitriding capability or modifying capability by each of the excited species supplied from the first excitation unit and the excited species supplied from the second excitation unit, it becomes possible to enhance the in-plane film-quality uniformity and the film-thickness uniformity of the silicon nitride film in the wafer 200. That is, by setting the in-plane distribution balance in the wafer 200 of excited species at a certain balance, and also, by differently setting the nitriding capability or modifying capability (for example, a supply amount, supply time, and supply method of the excited species) based on the excited species supplied from the respective excitation units, it becomes possible to enhance the in-plane film-quality uniformity and film-thickness uniformity of the silicon nitride film in the wafer 200.

For example, regardless of whether the in-plane distribution of excited species supplied from each of the buffer chambers 237b and 237c in the wafer 200 is set as illustrated in FIG. 10A or FIG. 10B, the nitridation processing or modification processing (removal processing of impurities such as chlorine, etc.) is performed for the central portion of the wafer 200 by the excited species supplied from the buffer chamber 237b, and the nitridation processing or modification processing is performed for the peripheral portion of the wafer 200 by the excited species supplied from the buffer chamber 237c. Thus, when the in-plane distribution of excited species in the wafer 200 is set as illustrated in FIG. 10A or FIG. 10B, and also, a ratio of the nitriding capability or modifying capability (impurity-removing capability) by each of the excited species supplied from the respective buffer chambers 237b and 237c is regulated, the in-plane film-quality uniformity and the film-thickness uniformity of the nitridation processing or modification processing of the silicon nitride layer can be more enhanced. That is, when desiring to comparatively facilitate the nitridation or modification of the silicon-containing layer in the central portion of the peripheral portion of the wafer 200, the in-plane distribution of excited species in the wafer 200 can be set as illustrated in FIG. 10B. Alternatively, the in-plane distribution of excited species in the wafer 200 may be set as illustrated in FIG. 10A or FIG. 10B, while the nitriding capability or modifying capability of the excited species supplied from the buffer chamber 237b is comparatively increased, or the nitriding capability or modifying capability of the excited species supplied from the buffer chamber 237c is comparatively decreased. On the other hand, when desiring to comparatively facilitate the nitridation or modification of the silicon-containing layer in the peripheral portion of the central portion of the wafer 200, the in-plane distribution of excited species in the wafer 200 can be set as illustrated in FIG. 10A. Alternatively, the in-plane distribution of excited species in the wafer 200 may be set as illustrated in FIG. 10A or FIG. 10B, while the nitriding capability or modifying capability of the excited species supplied from the buffer chamber 237c is comparatively increased, or the nitriding capability or modifying capability of the excited species supplied from the buffer chamber 237b is comparatively decreased. As a result, it becomes possible to more enhance the in-plane film-quality uniformity and the film-thickness uniformity of the silicon nitride film in the wafer 200.

Moreover, the in-plane distribution of excited species supplied from each of the buffer chambers 237b and 237c in the wafer 200 or a ratio of the nitriding capability or modifying capability by the excited species supplied from respective buffer chambers, for example, may be appropriately regulated by various conditions such as high-frequency power applied between the respective electrodes inside the buffer chambers 237b and 237c, a supply flow rate, supply time, supply method (intermittent supply, continuous supply, etc.) of $NH_3$ gas or $N_2$ gas supplied into each of the buffer chambers 237b and 237c, the kind of a reaction gas supplied into each of the buffer chambers 237b and 237c, an opening area or direction of each of the gas supply holes 238b and 238c respectively formed in the buffer chambers 237b and 237c.

For example, as shown in FIG. 5, the in-plane distribution of excited species supplied from each of the buffer chambers 237b and 237c in the wafer 200 or a ratio of the nitriding capability or modifying capability by each of the excited species supplied from respective buffer chambers may be regulated by changing a ratio of high-frequency power (supply power) applied between the first rod-shaped electrode 269b and the second rod-shaped electrode 270b in the first excitation unit and high-frequency power (supply power) applied between the first rod-shaped electrode 269c and the second rod-shaped electrode 270c in the second excitation unit. That is, the in-plane distribution of excited species supplied from each of the buffer chambers 237b and 237c in the wafer 200 or a ratio of the nitriding capability or modifying capability by each excited species supplied from respective buffer chambers may be regulated by differently setting the high-frequency power (supply power) applied between the first rod-shaped electrode 269b and the second rod-shaped electrode 270b in the first excitation unit and the high-frequency power (supply power) applied between the first rod-shaped electrode 269c and the second rod-shaped electrode 270c in the second excitation unit.

FIG. 5 shows an example in which power applied to at least one excitation unit in order for the at least one excitation unit to plasma-excite a reaction gas is greater than power applied to the other excitation unit in order for the other excitation unit to plasma-excite a reaction gas, namely, an example in which the high-frequency power applied between the first rod-shaped electrode 269b and the second rod-shaped electrode 270b in the first excitation unit is greater than the high-frequency power applied between the first rod-shaped electrode 269c and the second rod-shaped electrode 270c in the second excitation unit. That is, FIG. 5 illustrates an example in which the high-frequency power applied between the first rod-shaped electrode 269c and the second rod-shaped electrode 270c in the second excitation unit is less than the high-frequency power applied between the first rod-shaped electrode 269b and the second rod-shaped electrode 270b in the first excitation unit. In this case, the high-frequency power applied between the first rod-shaped electrode 269b and the second rod-shaped electrode 270b in the first excitation unit may be set to, for example, 100 to 1,000 W, and the high-frequency power applied between the first rod-shaped electrode 269c and the second rod-shaped electrode 270c in the second excitation unit may be set to, for example, 50 to 500 W. Therefore, the in-plane distribution of excited species (plasma-excited $NH_3$ gas), supplied from each of the buffer chambers 237b and 237c in the wafer 200, may be set as illustrated in FIG. 10A or FIG. 10B, and also, the amount of the excited species supplied from the buffer chamber 237b may be greater than the amount of the excited species supplied from the buffer chamber 237c.

Figure 6:
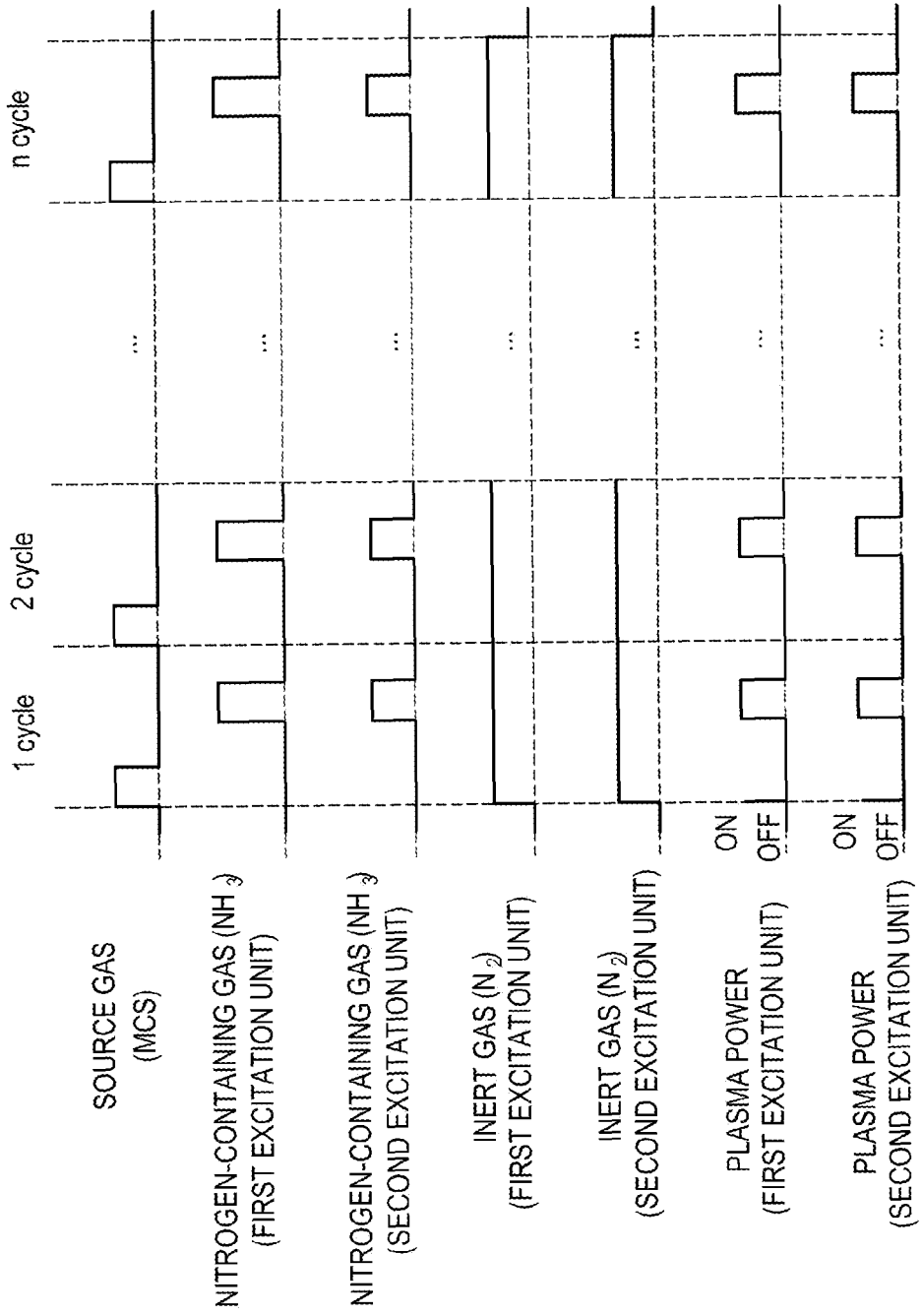
FIG. 6 is a diagram showing another example of gas supply and plasma power supply timings in a film forming sequence according to an embodiment of the present disclosure.

For example, as shown in FIG. 6, the in-plane distribution of excited species supplied from each of the buffer chambers 237b and 237c in the wafer 200 or a ratio of the nitriding capability or modifying capability by each of the excited species supplied from respective buffer chambers may be regulated by changing a ratio of a flow rate of an $NH_3$ gas or an $N_2$ gas supplied into the first excitation unit (i.e., the buffer chamber 237b) and a flow rate of an $NH_3$ gas or an $N_2$ gas supplied into the second excitation unit (i.e., the buffer chamber 237c). That is, the in-plane distribution of excited species supplied from each of the buffer chambers 237b and 237c in the wafer 200 or a ratio of the nitriding capability or modifying capability by each of the excited species supplied from respective buffer chambers may be regulated by differentiating the flow rate of the $NH_3$ gas or the $N_2$ gas supplied into the first excitation unit (i.e., the buffer chamber 237b) from the flow rate of the $NH_3$ gas or the $N_2$ gas supplied into the second excitation unit (i.e., the buffer chamber 237c).

FIG. 6 shows an example in which a flow rate of a reaction gas supplied to at least one excitation unit is greater than a flow rate of a reaction gas supplied to the other excitation unit, namely, an example in which the flow rate of the $NH_3$ gas supplied into the buffer chamber 237b is greater than the flow rate of the $NH_3$ gas supplied into the buffer chamber 237c. That is, FIG. 6 shows an example in which the flow rate of the $NH_3$ gas supplied into the buffer chamber 237c is less than the flow rate of the $NH_3$ gas supplied into the buffer chamber 237b. In this case, the flow rate of the $NH_3$ gas supplied into the buffer chamber 237b may be set to, for example, 2 to 10 slm, and the flow rate of the $NH_3$ gas supplied into the buffer chamber 237c may be set to, for example, 1 to 5 slm. Therefore, the in-plane distribution of excited species (plasma-excited $NH_3$ gas), supplied from each of the buffer chambers 237b and 237c in the wafer 200, may be set as illustrated in FIG. 10A or FIG. 10B, and also, the amount of the excited species supplied from the buffer chamber 237b may be greater than the amount of the excited species supplied from the buffer chamber 237c.

Figure 7:
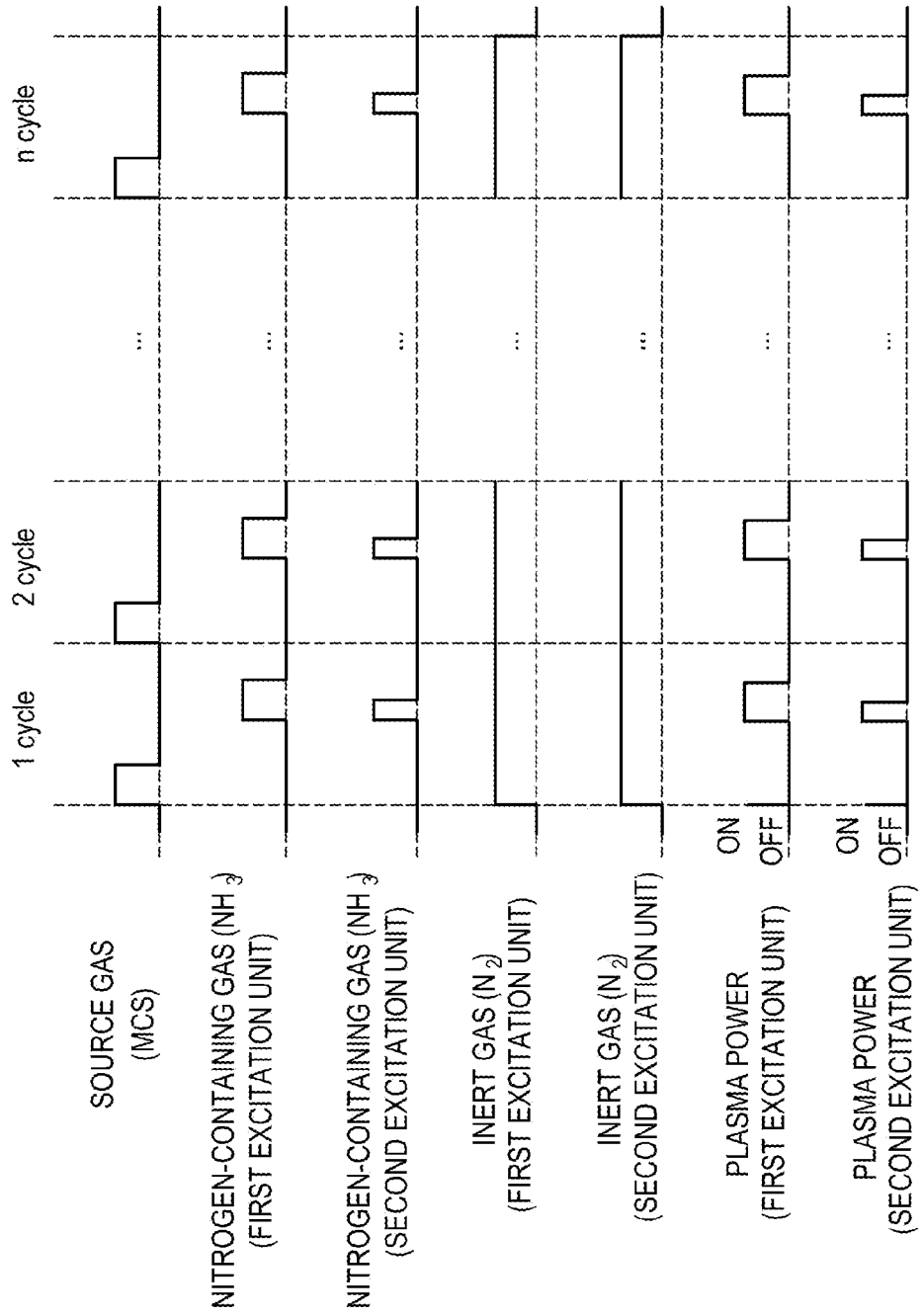
FIG. 7 is a diagram showing still another example of gas supply and plasma power supply timings in a film forming sequence according to an embodiment of the present disclosure.
Figure 8:
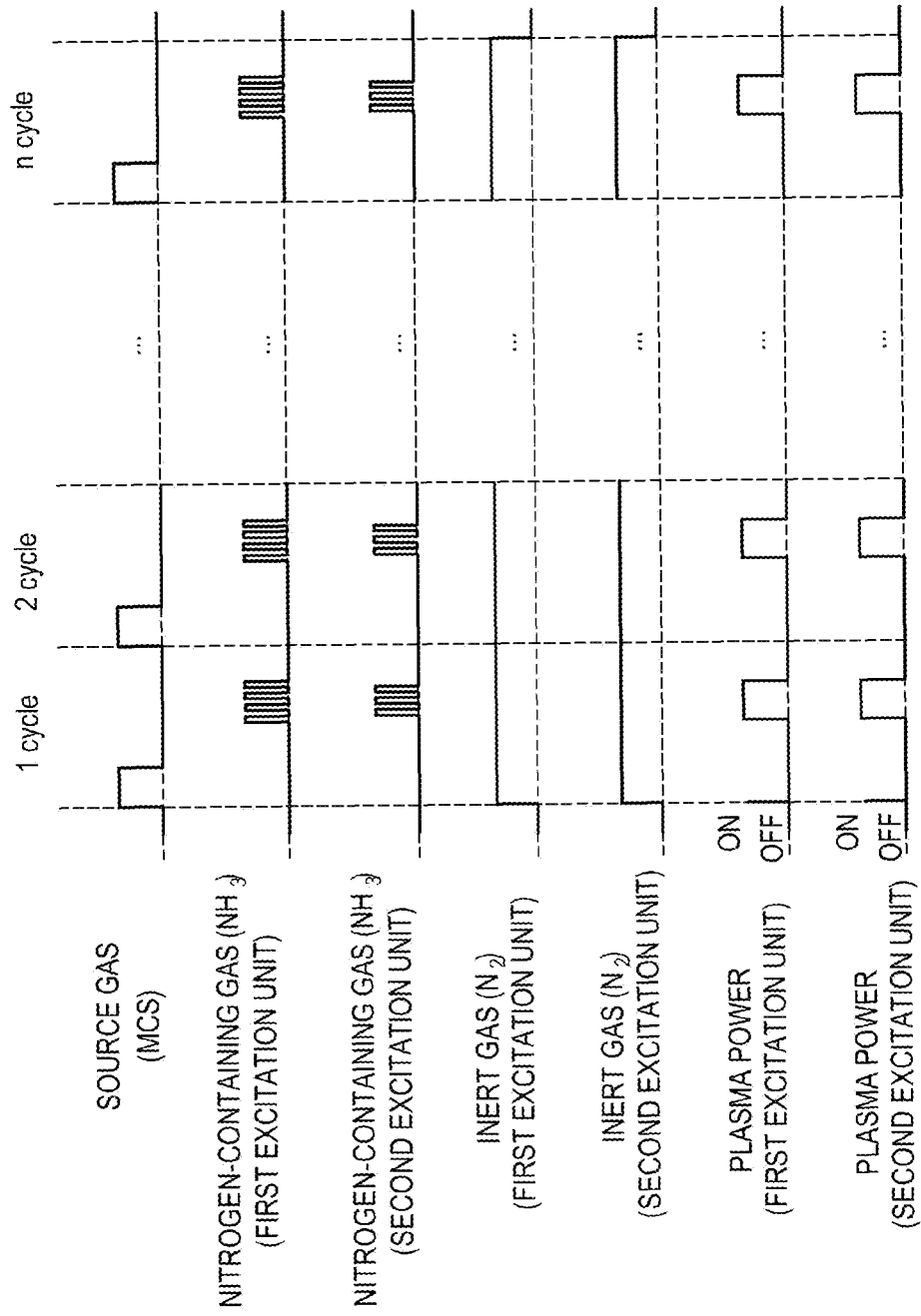
FIG. 8 is a diagram showing yet another example of gas supply and plasma power supply timings in a film forming sequence according to an embodiment of the present disclosure.
Figure 9:
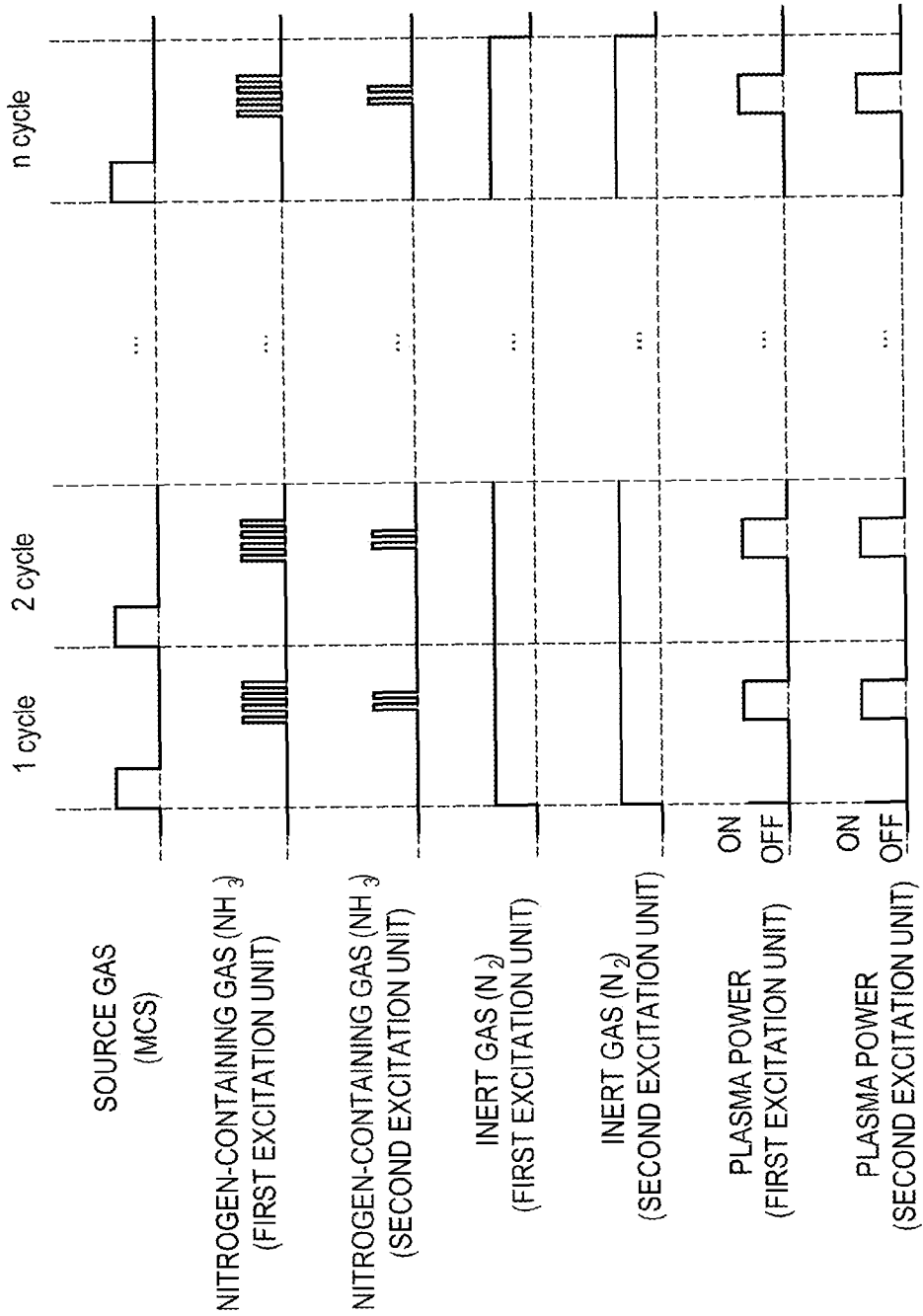
FIG. 9 is a diagram showing yet another example of gas supply and plasma power supply timings in a film forming sequence according to an embodiment of the present disclosure.

Moreover, for example, as shown in FIGS. 7 to 9, the in-plane distribution of excited species supplied from each of the buffer chambers 237b and 237c in the wafer 200 or a ratio of the nitriding capability or modifying capability by each of the excited species may be regulated by regulating a ratio of a supply time of the $NH_3$ gas or the $N_2$ gas to the first excitation unit (i.e., the buffer chamber 237b) and a supply time of the $NH_3$ gas or the $N_2$ gas supplied into the second excitation unit (i.e., the buffer chamber 237c). That is, the in-plane distribution of excited species supplied from each of the buffer chambers 237b and 237c in the wafer 200 or a ratio of the nitriding capability or modifying capability by each of the excited species may be regulated by differentiating the supply time of the $NH_3$ gas or the $N_2$ gas supplied into the first excitation unit (i.e., the buffer chamber 237b) from the supply time of the $NH_3$ gas or the $N_2$ gas supplied into the second excitation unit (i.e., the buffer chamber 237c).

FIG. 7 shows an example in which a supply time of a reaction gas supplied to at least one excitation unit is longer than a supply time of a reaction gas supplied to the other excitation unit, namely, in step 3a, an example in which the supply time of the $NH_3$ gas supplied into the buffer chamber 237b is longer than the supply time of the $NH_3$ gas supplied into the buffer chamber 237c. That is, FIG. 7 shows an example in which the supply time of the $NH_3$ gas supplied into the buffer chamber 237c is shorter than the supply time of the $NH_3$ gas supplied into the buffer chamber 237b in step 3a. In this case, the supply time of the $NH_3$ gas supplied into the buffer chamber 237b may be set to, for example, 2 to 120 sec, and the supply time of the $NH_3$ gas supplied into the buffer chamber 237c may be set to, for example, 1 to 60 sec. Therefore, the in-plane distribution of excited species (plasma-excited $NH_3$ gas), supplied from each of the buffer chambers 237b and 237c in the wafer 200, may be set as illustrated in FIG. 10A or FIG. 10B. Further, the supply time of excited species supplied from the buffer chamber 237b may be longer than the supply time of excited species supplied from the buffer chamber 237c. Furthermore, the amount of the excited species supplied from the buffer chamber 237b may be greater than the amount of the excited species supplied from the buffer chamber 237c.

FIG. 8 shows an example in which a method of supplying a reaction gas to at least one excitation unit differs from a method of supplying a reaction gas to the other excitation unit, namely, an example in which the $NH_3$ gas is intermittently supplied into each of the buffer chambers 237b and 237c, a supply timing of the $NH_3$ gas to the buffer chamber 237b is not synchronized (asynchronous) with a supply timing of the $NH_3$ gas to the buffer chamber 237c, and the number of times (pulse number) for the $NH_3$ gas supplied into the buffer chamber 237b is more than the number of times (pulse number) for the $NH_3$ gas supplied into the buffer chamber 237c, in step 3a. That is, FIG. 8 shows an example in which the excited species are intermittently supplied from the respective buffer chambers 237b and 237c, a supply timing of the excited species supplied from the buffer chamber 237b is not synchronized (asynchronous) with a supply timing of the excited species supplied from the buffer chamber 237c, and the number of times (pulse number) for the excited species supplied from the buffer chamber 237b is more than the number of times (pulse number) for the excited species supplied from the buffer chamber 237c, in step 3a. In this case, the number of times (pulse number) for the NH$_3$ gas supplied into the buffer chamber 237b may be, for example, 5 to 60 times, and the number of times (pulse number) for the NH$_3$ gas supplied into the buffer chamber 237c may be, for example, 1 to 30 times. Therefore, the in-plane distribution of excited species (plasma-excited NH$_3$ gas), supplied from each of the buffer chambers 237b and 237c in the wafer 200, may be set as illustrated in FIG. 10A or FIG. 10B, and also, the amount of the excited species supplied from the buffer chamber 237b may be greater than the amount of the excited species supplied from the buffer chamber 237c.

FIG. 9 shows an example in which a method of supplying a reaction gas to at least one excitation unit differs from a method of supplying a reaction gas to the other excitation unit, namely, an example in which the NH$_3$ gas is intermittently supplied into each of the buffer chambers 237b and 237c, a supply timing of the NH$_3$ gas to the buffer chamber 237b is synchronized with a supply timing of the NH$_3$ gas to the buffer chamber 237c, and the number of times (pulse number) for the NH$_3$ gas supplied into the buffer chamber 237b is greater than the number of times (pulse number) for the NH$_3$ gas supplied into the buffer chamber 237c, in step 3a. That is, FIG. 9 shows an example in which the excited species are intermittently supplied from the respective buffer chambers 237b and 237c, a supply timing of the excited species supplied from the buffer chamber 237b is synchronized with a supply timing of the excited species supplied from the buffer chamber 237c, and the number of times (pulse number) for the excited species supplied from the buffer chamber 237b is greater than the number of times (pulse number) the excited species are supplied from the buffer chamber 237c, in step 3a. In this case, the number of times (pulse number) for the NH$_3$ gas supplied into the buffer chamber 237b may be, for example, 5 to 60 times, and the number of times (pulse number) for the NH$_3$ gas supplied into the buffer chamber 237c may be, for example, 1 to 30 times. Therefore, the in-plane distribution of excited species (plasma-excited NH$_3$ gas), supplied from each of the buffer chambers 237b and 237c in the wafer 200, may be set as illustrated in FIG. 10A or FIG. 10B, and also, the amount of the excited species supplied from the buffer chamber 237b may be greater than the amount of the excited species supplied from the buffer chamber 237c.

Moreover, in step 3a, when the NH$_3$ gas is intermittently supplied into the buffer chambers 237b and 237c, a supply timing of the NH$_3$ gas to the inside of the buffer chamber 237b may not be synchronized (asynchronous) with a supply timing of the NH$_3$ gas to the inside of the buffer chamber 237c as described in FIG. 8, or the supply timings may be synchronized with each other as described in FIG. 9, or the supply timings may be partially synchronized with each other and may not partially be synchronized with each other. Further, in step 3a, the NH$_3$ gas may be intermittently supplied into the buffer chamber 237b, and the NH$_3$ gas may be continuously supplied into the buffer chamber 237c. Furthermore, in step 3a, the NH$_3$ gas may be continuously supplied into the buffer chamber 237b, and the NH$_3$ gas may be intermittently supplied into the buffer chamber 237c. That is, the NH$_3$ gas may be intermittently supplied into any one of the buffer chambers 237b and 237c.

Moreover, for example, the in-plane distribution of excited species supplied from each of the buffer chambers 237b and 237c in the wafer 200 or a ratio of the nitriding capability or modifying capability by each of the excited species may be regulated by differently setting the kind of a reaction gas supplied to at least one excitation unit and the kind of a reaction gas supplied to the other excitation unit, namely, by differently setting the kind of a reaction gas supplied into the first excitation unit (i.e., the buffer chamber 237b) and the kind of a reaction gas supplied into the second excitation unit (i.e., the buffer chamber 237c). When the kinds of reaction gases differ, the service lifes (time taken until excited species are generated and then deactivated) of generated excited species change, and thus, distances that excited species supplied from the gas supply holes 238b and 238c can reach until the species are deactivated (depleted) differ. Thus, for example, by using the gas (in which the service life of a generated excited species is relatively long) as a reaction gas supplied into the buffer chamber 237b and using the gas (in which the service life of a generated excited species is relatively short) as a reaction gas supplied into the buffer chamber 237c, the in-plane distribution in the wafer 200 of excited species (plasma-excited NH$_3$ gas), supplied from each of the buffer chambers 237b and 237c, may be set as illustrated in FIG. 10A or FIG. 10B. Also, the amount of the excited species supplied from the buffer chamber 237b to the wafer 200 may be greater than the amount of the excited species supplied from the buffer chamber 237c to the wafer 200.

Figure 15A:
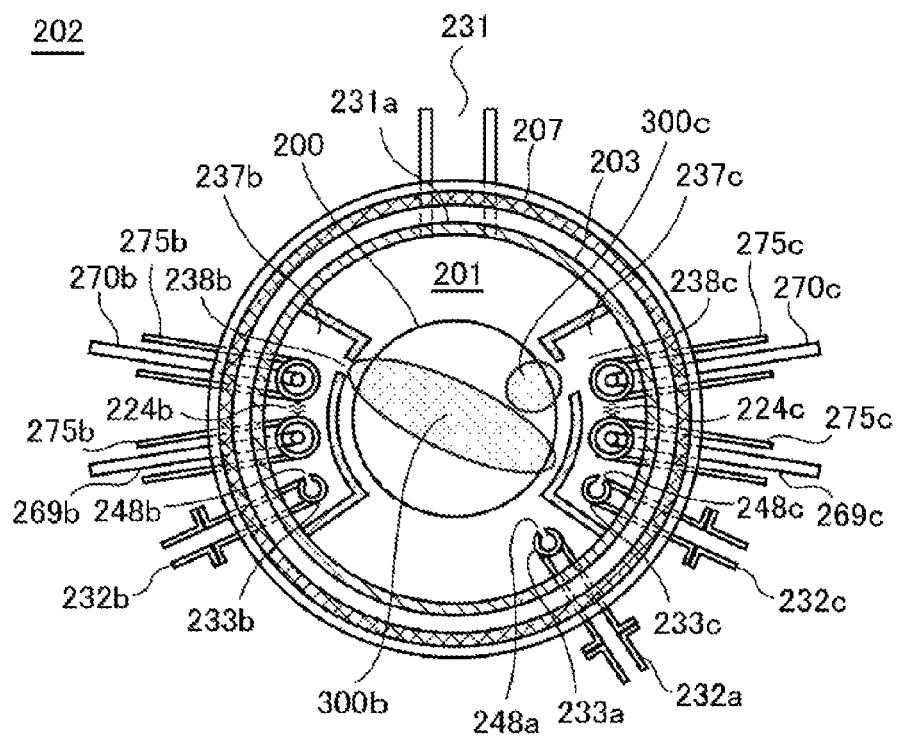
FIG. 15A depicts an example of operation that regulates distribution balance in a substrate plane of excited species supplied from a plurality of buffer chambers by changing a structure of a gas supply hole.

Moreover, for example, as illustrated in FIG. 15A, the in-plane distribution in the wafer 200 of excited species supplied from each of the buffer chambers 237b and 237c or a ratio of the nitriding capability or modifying capability by each of the excited species may be regulated by differently forming an opening area of a supply hole for supplying excited species from at least one excitation unit and an opening area of a supply hole for supplying excited species from the other excitation unit, namely, by differently setting an opening area S1 of the gas supply hole 238b disposed in the first excitation unit (i.e., the buffer chamber 237b) and an opening area S2 of the gas supply hole 238c disposed in the second excitation unit (i.e., the buffer chamber 237c). For example, when a condition for generating excited species in the buffer chamber 237b is the same as a condition for generating excited species in the buffer chamber 237c, namely, when the amount of a generated excited species per unit time in the buffer chamber 237b is the same as the amount of a generated excited species per unit time in the buffer chamber 237c, a difference occurs between flow velocities of the respective excited species supplied from the gas supply holes 238b and 238c due to the different opening areas S1 and S2 of the respective gas supply holes 238b and 238c (i.e., a flow velocity is high in a small opening area, and a flow velocity is low in a large opening area), and thus, distances that the respective excited species can reach differ. For this reason, for example, when a condition for generating excited species in the buffer chamber 237b is the same as a condition for generating excited species in the buffer chamber 237c, the in-plane distribution of excited species (plasma-excited NH$_3$ gas), supplied from each of the buffer chambers 237b and 237c in the wafer 200, may be set as illustrated in FIG. 10A or FIG. 10B by forming the opening area S1 of the gas supply hole 238b less than the opening area S2 of the gas supply hole 238c.

Figure 15B:
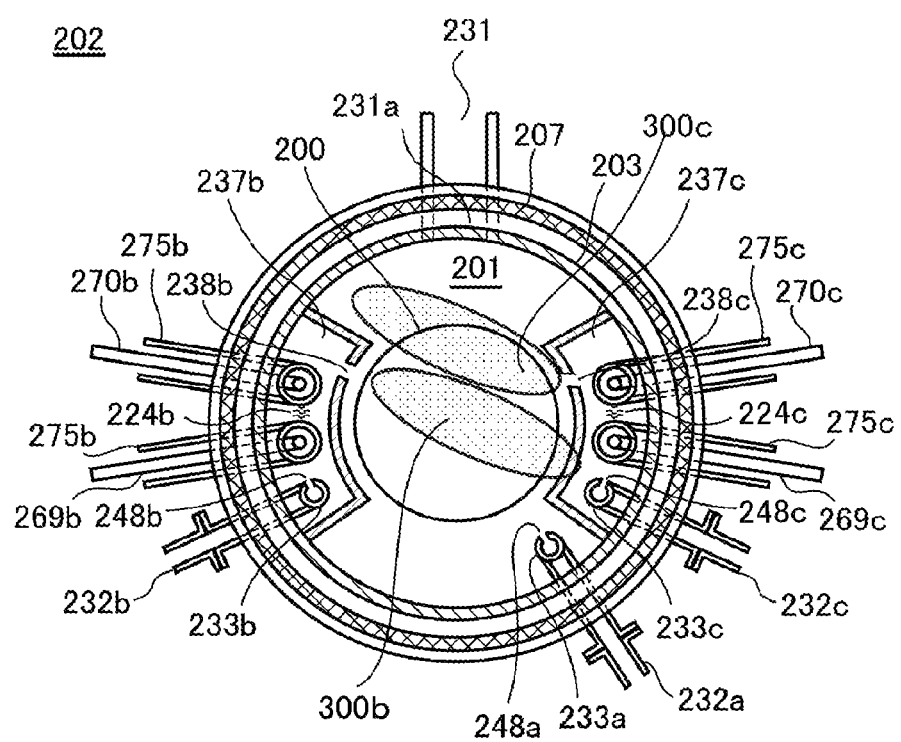
FIG. 15B depicts a modified example of operation that regulates distribution balance in a substrate plane of excited species supplied from a plurality of buffer chambers by changing a structure of a gas supply hole.

Moreover, for example, as illustrated in FIG. 15B, the in-plane distribution of excited species supplied from each of the buffer chambers 237b and 237c in the wafer 200 or a ratio of the nitriding capability or modifying capability by each of the excited species may be regulated by forming a supply hole (through which excited species are supplied from at least one excitation unit) in a direction in which the excited species flows toward the central portion of the wafer 200 and forming a supply hole (through which excited species are supplied from the other excitation unit) in a direction in which the excited species flows toward the peripheral portion of the wafer 200, namely, by forming one of the gas supply holes 238b and 238c in the direction in which the excited species flows toward the central portion of the wafer 200 and forming the other in the direction in which the excited species flows toward the peripheral portion of the wafer 200.

Moreover, in a method illustrated in FIG. 15A or FIG. 15B, a structure (opening area or direction) of each of the gas supply holes 238b and 238c and a relationship between the in-plane distributions of respective excited species supplied from the buffer chambers 237b and 237c in the wafer 200 are in advance obtained by a process such as a CFD process, and, on the basis of the obtained structures and relationship, the structure of each of the gas supply holes 238b and 238c is set to obtain a desired distribution of excited species. However, in this case, it is required to change the hardware of the substrate processing apparatus (mechanic processing on the side walls of the buffer chambers 237b and 237c). Further, in this case, the structure of each of the gas supply holes 238b and 238c is fixed, and thus, the in-plane distribution of excited species supplied from each of the buffer chambers 237b and 237c in the wafer 200 can be precisely regulated by regulating conditions in which the excited species are generated in the buffer chambers 237b and 237c. On the other hand, in the method illustrated in FIG. 15A or FIG. 15B or a method of differently setting the kinds of reaction gases supplied into the buffer chambers 237b and 237c, it is not required to change the hardware of the substrate processing apparatus, and the in-plane distribution of excited species supplied from each of the buffer chambers 237b and 237c in the wafer 200 and a ratio of the nitriding capability or modifying capability by each of the excited species may be appropriately regulated by changing the process recipe or changing the kind of a reaction gas.

In this way, the in-plane distribution of respective excited species in the wafer 200 and a ratio of the nitriding capability or modifying capability by each of the excited species may be appropriately regulated by differently setting a condition for generating excited species supplied from at least one excitation unit and a condition for generating excited species supplied from the other excitation unit, or by differently setting a condition for supplying excited species supplied from at least one excitation unit and a condition for supplying excited species supplied from the other excitation unit. Furthermore, by controlling the in-plane distribution balance of excited species supplied from each of the plurality of excitation units in the wafer 200, it becomes possible to enhance the in-plane uniformity of nitridation processing or modification processing (removal processing of impurities such as chlorine, etc.) in the wafer 200. As a result, it becomes possible to further enhance the in-plane film-quality uniformity and the film-thickness uniformity of the silicon nitride film in the wafer 200. Also, the method of controlling the in-plane distribution balance of excited species supplied from each of the plurality of excitation units in the wafer 200 may be performed in any combination thereof.

A nitrogen-containing gas may use a diazene ($N_2H_2$) gas, a hydrazine ($N_2H_4$) gas, and an $N_3H_8$ gas as well as an ammonia ($NH_3$) gas, and also, may use an amine-based gas, containing a nitrogen element, such as triethylamine (($C_2H_5$)$_3$N, abbreviated to TEA) gas. Also, when the kind of a reaction gas supplied into the buffer chamber 237b differs from the kind of a reaction gas supplied into the buffer chamber 237c, one of the above described nitrogen-containing gases may be supplied into the buffer chamber 237b and another nitrogen-containing gas may be supplied into the buffer chamber 237c, or, one of the above described nitrogen-containing gases may be supplied into the buffer chamber 237b and at least one of an $N_2$ gas, a $H_2$ gas, and an Ar gas may be supplied as a reaction gas into the buffer chamber 237c. For example, an ammonia ($NH_3$) gas may be supplied into the buffer chamber 237b, and an $N_2$ gas may be supplied into the buffer chamber 237c.

[Step 4a]

A silicon-containing layer is changed to a silicon nitride layer, and then, the supply of the $NH_3$ gas is stopped by closing the valve 243b of the second gas supply pipe 232b and the valve 243c of the third gas supply pipe 232c. At this point, by opening the APC valve 244 of the exhaust pipe 231, the inside of the processing chamber 201 is vacuum-exhausted by the vacuum pump 246, and the $NH_3$ gas, which is left in the processing chamber 201 and has not reacted or contributed to form the silicon nitride layer, or a reaction byproduct is removed from the inside of the processing chamber 201. At this point, further, by opening the valves 243e, 243f, and 243d, the supply of the $N_2$ gas as an inert gas into the processing chamber 201 is maintained. The $N_2$ gas acts as a purge gas, and thus, an effect of removing the $NH_3$ gas (which is left in the processing chamber 201 and has not reacted or have contributed to form the silicon nitride layer) or a reaction byproduct from the inside of the processing chamber 201 can more increase (second purge process).

Furthermore, at this point, the gas left in the processing chamber 201 may not completely be removed, and the inside of the processing chamber 201 may not completely be purged. If the amount of the gas left in the processing chamber 201 is small, it would not adversely affect subsequent processing performed in step 1a. In this case, a flow rate of the $N_2$ gas supplied into the processing chamber 201 does not require a high flow rate, and for example, by supplying an amount of gas equal to the volume of the reaction tube 203 (processing chamber 201), purging may be performed by a degree in which a bad influence will not occur in step 1a. As such, since the inside of the processing chamber 201 is not completely purged, a purging time is shortened, and thus, a throughput can be enhanced. Also, it becomes possible to minimize the consumption of the $N_2$ gas.

In this case, the temperature of the heater 207 is set such that the temperature of the wafer 200 is a constant temperature within a range of 250 to 630° C., preferably, a range of 300 to 500° C., identical to the case of supplying the $NH_3$ gas. A supply flow rate of the $N_2$ gas as a purge gas may become a flow rate within, for example, a range of 100 to 2,000 sccm (0.1 to 2 slm). The purge gas may use a rare gas such as an Ar, He, Ne, and Xe gas, as well as the $N_2$ gas.

(Performing Predetermined Number of Times)

The above described steps 1a to 4a constitute one cycle, and, by performing the one cycle a predetermined number of times, and preferably, a plurality of times, a silicon nitride film ($Si_3N_4$ film, hereinafter simply referred to as a SiN film) having a predetermined film thickness is formed on the wafer 200.

Moreover, when the cycle is performed a plurality of times, in each step subsequent to at least the second cycle, a description of "a predetermined gas is supplied to the wafer 200" may denote that "a predetermined gas is supplied to a layer formed on the wafer 200, namely, to the outermost surface of the wafer 200 which is a stack," and a description of "a predetermined layer is formed on the wafer 200" may denote that "a predetermined layer is formed on a layer formed on the wafer 200, namely, on the outermost surface of the wafer 200 which is a stack." This is as described above. Also, this is applied to another embodiment which will be described below.

(Return to Purge and Atmospheric Pressure)

When a silicon oxide film having a predetermined film thickness is formed, the valves 243d to 243f are opened, and an N₂ gas is supplied as an inert gas from each of the first inert gas supply pipe 232d, second inert gas supply pipe 232e, and third inert gas supply pipe 232f into the processing chamber 201, and exhausted from the exhaust pipe 231. The N₂ gas acts as a purge gas, and thus, the inside of the processing chamber 201 is purged with the inert gas, and the gas left in the processing chamber 201 is removed from the processing chamber 201 (purge). Subsequently, the atmosphere inside the processing chamber 201 is replaced with the inert gas, and a pressure inside the processing chamber 201 returns to a normal pressure (return to atmospheric pressure).

(Unloading of Boat and Discharging of Wafer)

Subsequently, the seal cap 219 is moved down by the boat elevator 115. Then, the lower end portion of the reaction tube 203 is opened and a processed wafer 200 is transferred from the lower end portion of the reaction tube 203 to outside the reaction tube 203 while being supported by the boat 217 (unload of boat). After that, the processed wafer 200 is taken out from the boat 217 (discharge of wafer).

(3) Effects According to the Embodiment

According to the embodiment, one or more effects as described below may be obtained.

(a) In step 1a according to the embodiment, the MCS gas whose chlorine (Cl)-containing rate is low and surface-adsorbing capability is high is used. Thus, the amount of chlorine supplied into the processing chamber 201 can be reduced. Accordingly, a ratio of chlorine bonding with the silicon-containing layer, namely, the number of Si—Cl bonds can be reduced, and thus, the silicon-containing layer having a low chlorine concentration is formed. This is one factor for forming the silicon nitride layer to have a low chlorine concentration, in step 3a. As a result, the silicon nitride layer having a low chlorine concentration, namely, a silicon nitride film having a high film density is formed, and thus, it becomes possible to enhance a tolerance of the silicon nitride film with respect to hydrogen fluoride. Also, it becomes possible to enhance the insulating properties of the silicon nitride film.

Moreover, by reducing the number of Si—Cl bonds in a silicon-containing layer, the number of Si—H bonds in the silicon-containing layer can be increased. The Si—Cl bond has bond energy greater than that of the Si—H bond, and thus obstructs the formation of a Si—N bond in step 3a, namely, the nitridation of the silicon-containing layer. On the other hand, the Si—H bond has bond energy lower than that of the Si—Cl bond, and thus facilitates the formation of the Si—N bond in step 3a, namely, the nitridation of the silicon-containing layer.

That is, by forming the silicon nitride layer having a small number of Si—Cl bonds, i.e., having a low chlorine concentration (by reducing the number of Si—Cl bonds in a layer), factors that obstruct the nitridation of the silicon-containing layer can be reduced, thus facilitating the nitridation of the silicon-containing layer in step 3a. Further, by increasing the number of Si—H bonds in the silicon-containing layer, factors that facilitate the nitridation of the silicon-containing layer can increase, thus more facilitating the nitridation of the silicon-containing layer in step 3a. Accordingly, it becomes possible to increase the nitridation efficiency of the silicon-containing layer in step 3a, and a nitridation time is shortened, thus shortening a processing time.

(b) In step 3a according to the present embodiment, the plurality of plasma generation units plasma-excite respective NH3 gases and, by supplying the plasma-excited NH3 gases from the respective plasma generation units, the silicon-containing layer is nitrided. As such, the amount of excited species supplied to the wafer 200 can be increased by using the plurality of plasma generation units, although respective high-frequency powers applied to the plasma generation units are low and the amount of a plasma output from each of the plasma generation units is small. Accordingly, it becomes possible to increase the amount of excited species supplied to the wafer 200 while the plasma damage of the wafer 200 or silicon-containing layer is prevented.

Moreover, when only one plasma generation unit is provided, it is required to increase a plasma output in order to increase the amount of excited species supplied to the wafer 200. However, in this case, a range that makes a plasma is excessively widened, and thus, even the wafer 200 can be exposed to a plasma. Furthermore, a large damage (plasma damage) can be caused to the wafer 200 or the silicon nitride film formed on the wafer 200. Also, the wafer 200 or a portion around the wafer 200 may be sputtered by plasma, and thus, particles can be generated, or the film quality of the silicon nitride film can be degraded. Also, the film quality of the silicon nitride film formed on the wafer 200 can be noticeably changed between the vicinity of an outer circumference of the wafer 200 exposed to plasma and the central axis of the wafer 200 unexposed to plasma.

On the other hand, as in the present embodiment, when the plurality of plasma generation units is used, the amount of excited species supplied to the wafer 200 can be increased while a plasma output from each of the plasma generation units is maintained small. Thus, the above described problems can be prevented.

(c) In the present embodiment, by using the plurality of plasma generation units, the plasma damage of the wafer 200 or silicon-containing layer is prevented, the amount of excited species supplied to the wafer 200 increases, and nitriding capability becomes higher, thus facilitating the nitridation of the silicon-containing layer. That is, it becomes possible to enhance nitridation efficiency. Furthermore, as the nitridation of the silicon-containing layer is saturated, a quick shift up to a self-limiting state (completely nitrided state) is possible, thus saving a nitridation time. As a result, the duration of time for forming the silicon nitride film can be shortened, and thus, it becomes possible to enhance productivity. Also, the in-plane uniformity of nitridation processing in the wafer 200 can be enhanced. That is, it becomes possible to more uniformly supply excited species to the in-plane entire area of the wafer 200, and for example, a noticeable difference in the film quality or film thickness of the silicon nitride film can be prevented between the vicinity of an outer circumference of the wafer 200 and the central axis of the wafer 200. Accordingly, it becomes possible to enhance the in-plane film-quality uniformity and the film-thickness uniformity of the silicon nitride film in the wafer 200.

(d) In the present embodiment, by using the plurality of plasma generation units, the plasma damage of the wafer 200 or silicon-containing layer is prevented, and the amount of excited species supplied to the wafer 200 increases, thus efficiently desorbing chlorine contained in the silicon-containing layer having a low chlorine concentration which has been formed in step 1a. Accordingly, the silicon-containing layer having a low chlorine concentration is formed, thus more decreasing a chlorine concentration of the silicon nitride film. As a result, the silicon nitride layer having a low chlorine concentration, namely, a silicon nitride film having a high film density is formed, and thus, it becomes possible to enhance a tolerance of the silicon nitride film with respect to hydrogen fluoride. Also, chlorine is efficiently desorbed, thus more enhancing nitridation efficiency. That is, chlorine that obstructs nitridation is efficiently desorbed from the silicon-containing layer, thus more enhancing nitridation efficiency. Further, the chlorine desorbed from the silicon-containing layer is exhausted from the exhaust pipe 231 to outside the processing chamber 201. Furthermore, the duration of time for forming the silicon nitride film can be more shortened, and thus, it becomes possible to more enhance productivity.

(e) In the present embodiment, by using the plurality of plasma generation units, the same effects as a case which increases the number of rotations of the wafer 200 in forming a film (quickening rotation speed) can be obtained, thus enhancing the in-plane film-thickness uniformity in the wafer 200 of the silicon nitride film. That is, in the film forming sequence according to the embodiment, the MCS gas or the $NH_3$ gas is intermittently supplied when the wafer 200 is rotating. However, in such sequence, there is a constant correlation between the number of rotations of the wafer 200 and the in-plane film-thickness uniformity in the wafer 200 of the silicon nitride film. Specifically, as the number of rotations becomes greater (as a rotation speed becomes quicker), the wafer 200 area covered by one-time gas supply increases, thus enhancing the in-plane film-thickness uniformity in the wafer 200 of the silicon nitride film. However, to prevent the vibration of the wafer 200, the number of rotations of the wafer 200 has the upper limit, and for example, the number of rotations of the wafer 200 can be difficult to be greater than 3 rpm. To overcome such limitations, in the embodiment, by using the two plasma generation units, an effect equal to the number of rotations being actually increased can be obtained, thus enhancing the in-plane film-thickness uniformity in the wafer 200 of the silicon nitride film. Such effects are particularly effective for a case in which the silicon nitride film has a thickness equal to or less than 50 Å.

(f) In the present embodiment, the in-plane distribution balance in the wafer 200 of excited species supplied from the plurality of excitation units (plasma generation units) is controlled. For example, the in-plane distribution of the excited species supplied from the first excitation unit in the wafer 200 may be a wide distribution in which the excited species deviate from the central portion of the wafer 200 and reaches a peripheral portion on the opposite side of the wafer 200, and the in-plane distribution of another excited species supplied from the second excitation unit in the wafer 200 may be a one-sided distribution in which the excited species reach only a peripheral portion of the wafer 200. Further, for example, the in-plane distribution of excited species supplied from the first excitation unit in the wafer 200 may be a distribution in which the excited species reach the central portion of the wafer 200 and does not reach the peripheral portion on the opposite side of the wafer 200, and the in-plane distribution of the another excited species supplied from the second excitation unit in the wafer 200 may be a one-sided distribution in which the excited species reach only the peripheral portion of the wafer 200. As a result, nitridation processing or modification processing (removal processing of impurities such as chlorine) in the central portion of the wafer 200 is performed by the excited species supplied from the first excitation unit, and nitridation processing or modification processing in the peripheral portion of the wafer 200 is performed by the excited species supplied from the second excitation unit. By setting the in-plane distribution of excited species in the wafer 200 like the above, a ratio of the nitriding capability or modifying capability power (impurity-removing power) by the excited species respectively supplied from the first excitation unit and the second excitation unit is regulated, and thus, it becomes possible to enhance the in-plane uniformity of nitridation processing or modification processing (removal processing of impurities such as chlorine, etc.) in the wafer 200 of the silicon-containing layer. Accordingly, it becomes possible to enhance the in-plane film-quality uniformity and film-thickness uniformity in the wafer 200 of the silicon nitride film.

(g) In the present embodiment, according to the film forming sequence of the embodiment, for example, in a low temperature range equal to or less than 500° C. or 400° C., the silicon nitride layer having a low chlorine concentration, namely, the silicon nitride film having a high film density is formed. Thus, a tolerance of the silicon nitride film with respect to hydrogen fluoride and the insulating properties of the silicon nitride film are enhanced, and thus, film quality can be enhanced. Further, by preventing the plasma damage of the wafer 200 or the silicon-containing layer and enhancing the nitridation efficiency of the silicon-containing layer, a nitridation time is shortened, and a processing time is shortened, thus enabling an increase in a throughput. Furthermore, by enhancing the in-plane uniformity of nitridation processing in the wafer 200, the in-plane film-quality uniformity and film-thickness uniformity in the wafer 200 of the silicon nitride film can be further enhanced. Also, the occurrence of a dangling bond caused by steric hindrance in forming a film can be decreased. Moreover, since a chlorine concentration in a film is low, the natural oxidation of the silicon nitride film while the wafer 200 is transferred, for example, while the boat is unloaded, can be prevented.

Also, it has been checked that a density of the silicon nitride film formed by the film forming sequence of the embodiment is greater than that of a general silicon nitride film formed by the alternate supply of a DCS gas and an $NH_3$ gas. Further, it has been checked that a concentration of impurities such as chlorine, etc. in the silicon nitride film formed by the film forming sequence of the embodiment is far lower than a concentration of impurities such as chlorine, etc. in the general silicon nitride film formed by the alternate supply of a DCS gas and an $NH_3$ gas. Also, according to the film forming sequence of the embodiment, even when a silane-based source gas containing no chlorine is used as a source gas, it has been checked that an etching rate with respect to hydrogen fluoride becomes low.

Another Embodiment of Present Disclosure

In the above description, the present disclosure has been described with reference to some aspects and embodiments, but the present disclosure is not limited to the above described aspects and embodiments. The present disclosure may be variously modified or changed without departing from the spirit and scope thereof.

In the above described embodiment, an example has been described in which steps 1a, 2a, 3a, and 4a are sequentially performed, which constitute one cycle, and, by performing the one cycle at least one time, and preferably, a plurality of times, the silicon nitride film having a predetermined film thickness is formed on the wafer 200. However, the order of performing step 1a and step 3a may be switched. That is, steps 3a, 2a, 1a and 4a may be sequentially performed in that order, which may constitute one cycle, and, by performing the one cycle at least one time, and preferably, a plurality of times, the silicon nitride film having a predetermined film thickness is formed on the wafer 200.

Figure 11A:
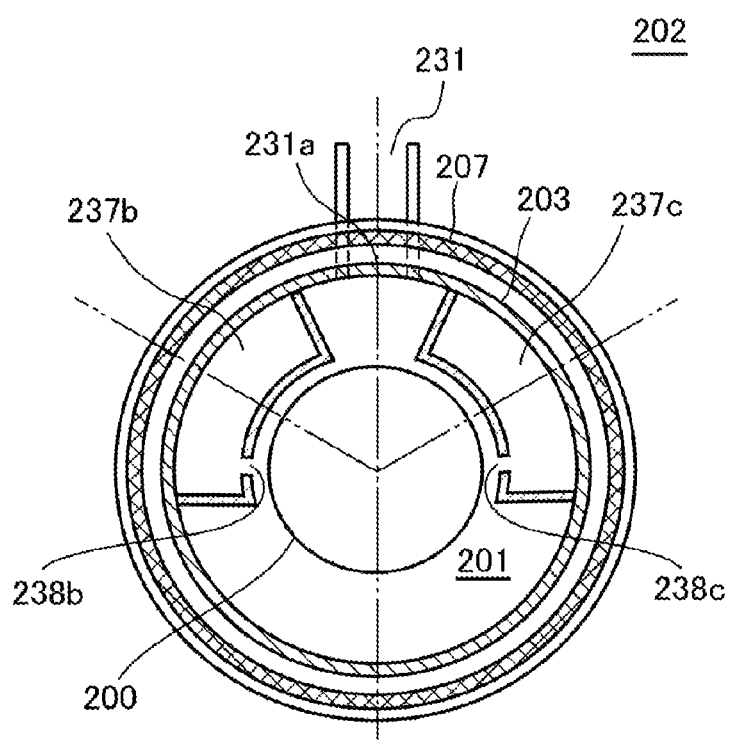
FIG. 11A is a sectional plan schematically illustrating a configuration of a vertical processing furnace of a substrate processing apparatus, in which a buffer chamber is disposed close to a side of an exhaust port, suitable for use in another embodiment of the present disclosure.
Figure 11B:
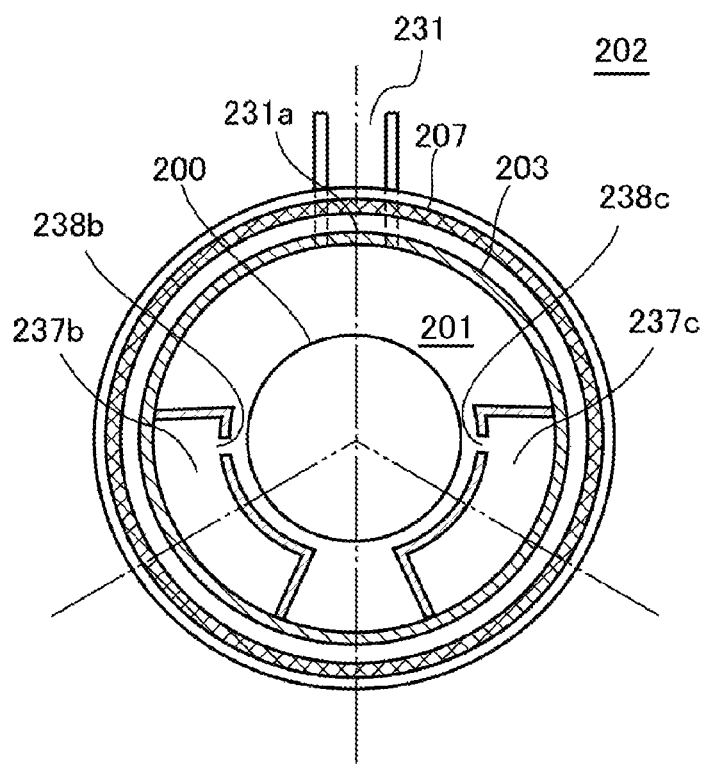
FIG. 11B is a sectional plan schematically illustrating a configuration of a vertical processing furnace of a substrate processing apparatus, in which a buffer chamber is disposed at a side far away from an exhaust port, suitable for use in another embodiment of the present disclosure.

Moreover, in the above described embodiment, an example has been described in which the corresponding side surfaces of the two buffer chambers 237b and 237c face each other with the center of the wafer 200 therebetween, but the present disclosure is not limited thereto. That is, when viewed from a plane, the two buffer chambers 237b and 237c may be disposed to be axisymmetric about a straight line (used as a target axis) that connects the center of the wafer 200 (center of the reaction tube 203) and the center of the exhaust port 231a. Further, as illustrated in FIG. 11A, the two buffer chambers 237b and 237c may be disposed closely to the side of the exhaust port 231a, or, as illustrated in FIG. 11B, the two buffer chambers 237b and 237c may be disposed closely to the side far away from the exhaust port 231a. In other words, a central angle formed of a straight line connecting the center of the buffer chamber 237b and the center of the wafer 200 and another straight line connecting the center of the buffer chamber 237c and the center of the wafer 200 (central angle of an arc having the respective centers of the buffer chambers 237b and 237c as a pair of end portions) is not limited to 180°, and may be less than 180° or more than 180°. Further, in each of FIGS. 2, 11A and 11B, the gas supply holes 238b and 238c of the respective buffer chambers 237b and 237c may be disposed to be axisymmetric about the straight line that connects the center of the wafer 200 (center of the reaction tube 203) and the center of the exhaust port 231a. Furthermore, in FIGS. 11A and 11B, for convenience of explanation, members other than the reaction tube 203, the heater 207, the wafer 200, the exhaust pipe 231, the exhaust port 231a, and the buffer chambers 237b and 237c are not illustrated.

Figure 12B:
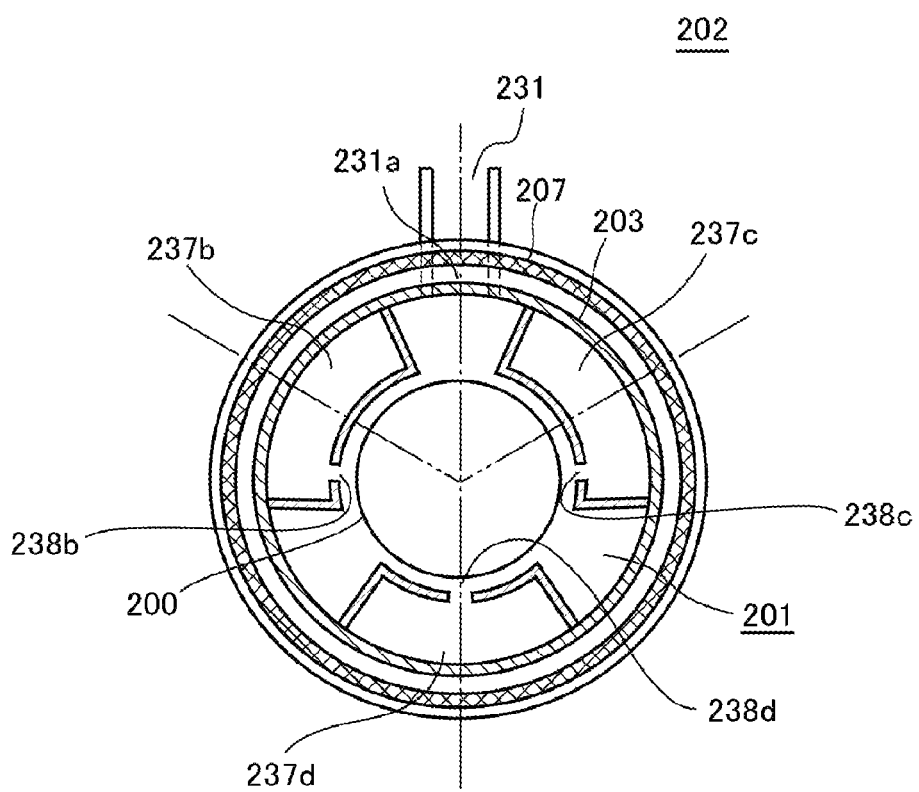
FIG. 12B is a sectional plan schematically illustrating a configuration of a vertical processing furnace of a substrate processing apparatus, in which three buffer chambers are provided, suitable for use in another embodiment of the present disclosure.

Moreover, in the above described embodiment, it has been described that the number of the disposed plasma generation units (excitation units) is two, but the number may be three or more. In this case, when viewed from a plane, the plurality of plasma generation units (excitation units) may be disposed to be axisymmetric about a straight line (used as a target axis) that connects the center of the wafer 200 (center of the reaction tube 203) and the center of the exhaust port 231a. For example, in a case in which the number of the disposed plasma generation units (excitation units) is four, as illustrated in FIG. 12A, when viewed from a plane, each of the buffer chambers 237b and 237c and the buffer chambers 237d and 237e may be disposed to be axisymmetric about a straight line (used as a target axis) that connects the center of the wafer 200 and the center of the exhaust port 231a. Further, in a case in which the number of the disposed plasma generation units (excitation units) is three, as illustrated in FIG. 12B, when viewed from a plane, the two buffer chambers 237b and 237c may be disposed to be axisymmetric about the straight line (used as a target axis) that connects the center of the wafer 200 and the center of the exhaust port 231a, and, the one buffer chamber 237d may be disposed such that the center of the buffer chamber 237d is disposed at the center between the two buffer chambers 237b and 237c, namely, on the straight line connecting the center of the wafer 200 and the center of the exhaust port 231a. Also, in FIGS. 11A and 11B, for convenience of explanation, members other than the reaction tube 203, the heater 207, the wafer 200, the exhaust pipe 231, the exhaust port 231a, and the buffer chambers 237b to 237e are not illustrated.

Moreover, in a case in which the number of the disposed plasma generation units (excitation units) is three or more, a plurality of buffer chambers may be disposed at an equal distance. For example, when the number of the disposed plasma generation units (excitation units) is four, as illustrated in FIG. 12A, the buffer chambers 237b to 237e may be disposed such that a central angle of each of four arcs having the respective centers of adjacent buffer chambers as a pair of end portions is 90° C. Also, when the number of the disposed plasma generation units (excitation units) is three, as illustrated in FIG. 12B, the buffer chambers 237b to 237d may be disposed such that a central angle of each of three arcs having the respective centers of adjacent buffer chambers as a pair of end portions becomes 120° C. Also, in all of FIGS. 12A and 12B, the gas supply holes 238b and 238c of the respective buffer chambers 237b and 237c may be disposed to be axisymmetric about the straight line that connects the center of the wafer 200 and the center of the exhaust port 231a. Since the plurality of buffer chambers is disposed at an equal distance, a uniform supply of excited species to the in-plane entire area of the wafer 200 can be achieved. Accordingly, the in-plane uniformity in the wafer 200 of nitridation processing is enhanced, and thus, the in-plane film-quality uniformity and film-thickness uniformity in the wafer 200 of the silicon nitride film can be enhanced.

Moreover, in the above described embodiment, provided may be an MCS gas supply source for supplying an MCS gas into the first gas supply pipe 232a or a temperature regulation unit that maintains a storage temperature of the MCS gas, for example, at about 30° C., in an upstream side (i.e., a gas storeroom, a cylinder cabinet, or the like) of the first gas supply pipe 232a. The MCS gas is high in decomposition, and thus can be decomposed at a storage temperature in a typical type of a special high-pressure gas. When monosilane ($SiH_4$) is generated by the decomposition of the MCS gas, the in-plane film-thickness uniformity of a silicon nitride film can be degraded, or productivity can be deteriorated. Also, when the storage temperature of the MCS gas is excessively low, the MCS gas becomes difficult to vaporize, and thus, a supply flow rate of the MCS gas to the processing chamber 201 can be reduced. Such problems can be solved by providing the temperature regulation unit.

Figure 13:
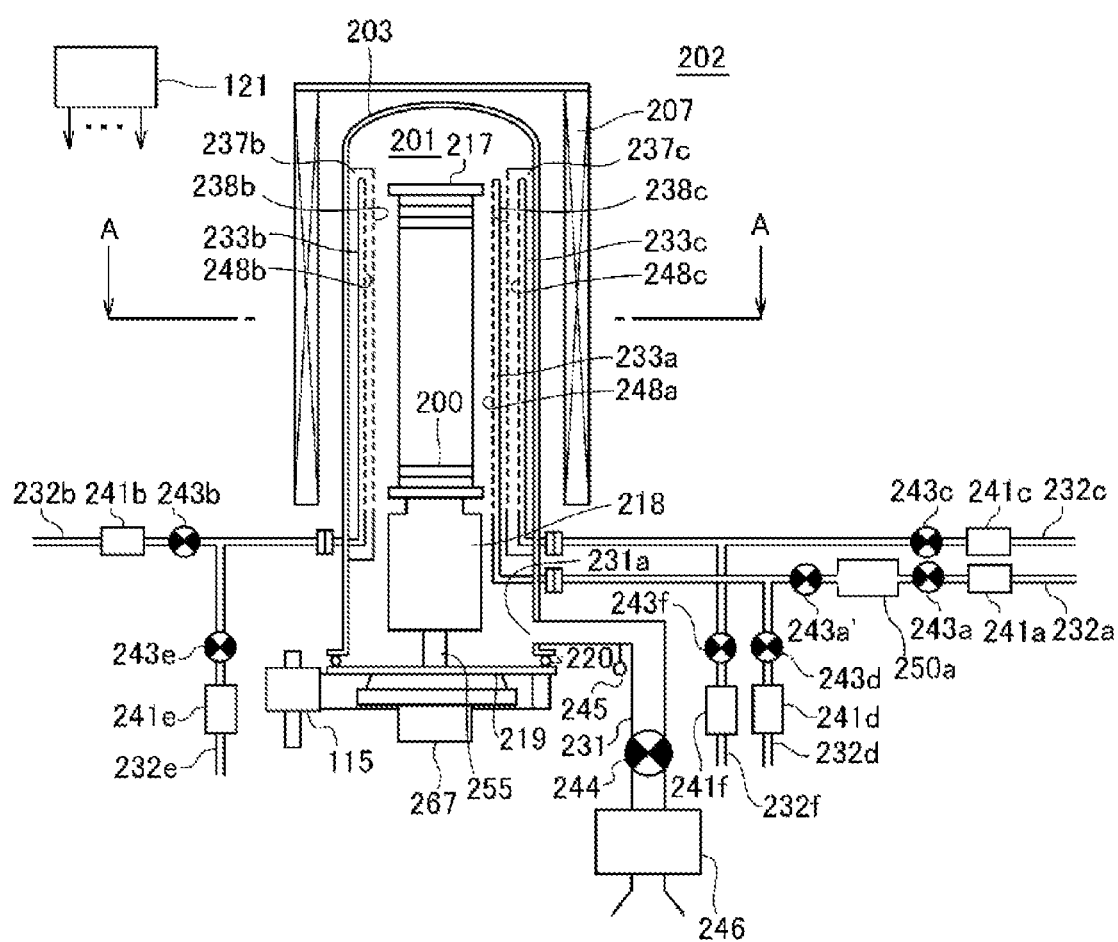
FIG. 13 is a vertical sectional view schematically illustrating a configuration of a part of a vertical processing furnace in a substrate processing apparatus, which enables a flash supply of an MCS gas, suitable for use in another embodiment of the present disclosure.

Moreover, for example, in the above described embodiment, in supplying the MCS gas into the processing chamber 201 (steps 1a and 1b), the MCS gas is supplied into the processing chamber 201 while continuously exhausting the inside of the processing chamber 201 in a state in which the APC valve 244 is opened. However, the present disclosure is not limited thereto. For example, as illustrated in FIG. 13, a gas storage unit (tank) 250a may be disposed at a more downstream side than the valve 243a of the first gas supply pipe 232a, a high-pressure MCS gas stored in the gas storage unit 250a may be supplied into the depressurized processing chamber 201 at one time (in a pulse type) in a state in which the APC valve 244 is closed, and then, the inside of the processing chamber 201 pressurized by the supply of the MCS gas may be maintained for a predetermined time.

In order to supply the MCS gas at one time by using the gas storage unit 250a, a valve 243a' disposed at a more downstream side than the gas storage unit 250a of the first gas supply pipe 232a is first closed, and, by opening the valve 243a disposed at a more upstream side than the gas storage unit 250a, the MCS gas is stored in the gas storage unit 250a. Subsequently, when a certain amount of MCS gas having a certain pressure is stored in the gas storage unit 250a, the valve 243a at the upstream side is closed. The MCS gas is stored in the gas storage unit 250a such that a pressure inside the gas storage unit 250a becomes, for example, 20,000 Pa or more. The amount of the MCS gas stored in the gas storage unit 250a, for example, may be 100 to 1,000 cc. Further, a conductance between the gas storage unit 250a and the processing chamber 201 may be $1.5 \times 10^{-3}$ m³/s. Furthermore, considering a ratio of a volume of the processing chamber 201 and a volume of the gas storage unit 250a necessary for the volume of the processing chamber 201, when the volume of the processing chamber 201 is, for example, 100 L (liters), the volume of the gas storage unit 250a may be 100 or 300 cc, and may be $1/1,000$ to $3/1,000$ times the volume of the processing chamber 201.

When the gas storage unit 250a is being charged with the MCS gas, the vacuum pump 246 exhausts the inside of the processing chamber 201 such that a pressure inside the processing chamber 201 becomes 20 Pa or less. When the charging of the MCS gas in the gas storage unit 250a and the exhaust of the processing chamber 201 are completed, the exhaust of the processing chamber 201 is stopped by closing the APC valve 244, and then, the valve 243a' of the first gas supply pipe 232a is opened. Therefore, the high-pressure MCS gas stored in the gas storage unit 250a is supplied into the gas processing chamber 201 at one time (in a pulse type). At this point, since the APC valve 244 of the exhaust pipe 231 is closed, the pressure inside the processing chamber 201 increases rapidly, and for example, may increase up to 931 Pa (7 Torr). Subsequently, a pressurized state inside the processing chamber 201 is maintained for a predetermined time (for example, 1 to 10 sec), and thus, the wafer 200 is exposed to a high-pressure MCS gas atmosphere, thereby forming a silicon-containing layer on the wafer 200.

Like this, when the MCS gas is supplied at one time by using the gas storage unit 250a, for example, the MCS gas flown out from the first nozzle 233a into the processing chamber 201 is approximately accelerated to the sound velocity due to a pressure difference between the inside of the gas storage unit 250a and the inside of the processing chamber 201, and thus, the velocity of the MCS gas on the wafer 200 becomes as quick as about several tens of m/sec. As a result, the MCS gas is efficiently supplied to the central portion of the wafer 200. Accordingly, the in-plane film-quality uniformity and film-thickness uniformity in the wafer 200 of the silicon nitride film can be enhanced. Hereinafter, this supply method is referred to as a flash flow.

Figure 14:
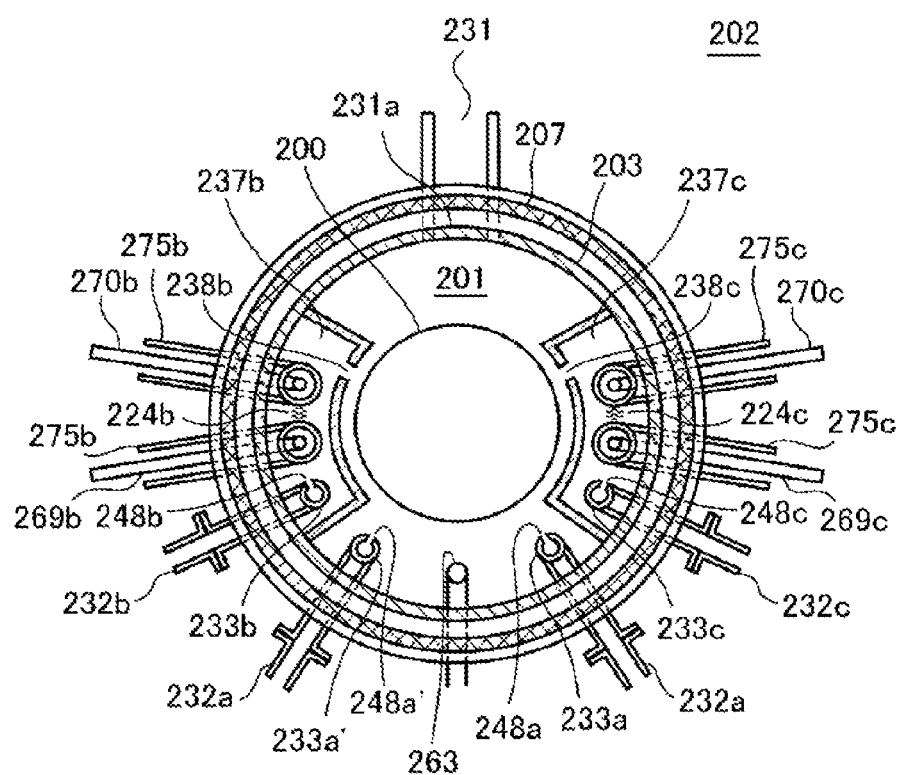
FIG. 14 is a cross sectional view schematically illustrating a configuration of a part of a vertical processing furnace of a substrate processing apparatus, in which a plurality of nozzles for supplying an MCS gas is provided, suitable for use in another embodiment of the present disclosure.

Moreover, in the above described embodiment, an example has been described in which the MCS gas is supplied through the one nozzle 233a, but the present disclosure is not limited thereto. As another example, the MCS gas may be supplied through a plurality of nozzles. For example, as illustrated in FIG. 14, a nozzle 233a' having the same shape as the nozzle 233a may be further provided as a nozzle for supplying the MCS gas. In this case, similar to the buffer chambers 237b and 237c, when viewed from a plane, the nozzles 233a and 233a' may be disposed to be axisymmetric about the straight line (used as a target axis) that connects the center of the wafer 200 (center of the reaction tube 203) and the center of the exhaust port 231a. That is, gas supply holes 248a and 248a' of the respective nozzles 233a and 233a' may be disposed to be axisymmetric about the straight line (used as a target axis) that connects the center of the wafer 200 (center of the reaction tube 203) and the center of the exhaust port 231a. Thus, gas streams of the MCS gases flowing from the two nozzles 233a and 233a' to the wafer 200 become uniform. That is, the gas streams of the MCS gases flowing from the two nozzles 233a and 233a' to the wafer 200 are axisymmetric about the straight line (used as a target axis) that connects the center of the wafer 200 and the center of the exhaust port 231a. As a result, the MCS gas can be uniformly supplied into the wafer 200 plane, and thus, the in-plane film-quality uniformity and film-thickness uniformity in the wafer 200 of the silicon nitride film can be enhanced more.

Moreover, in the above described embodiment, an example has been described in which the excited species supplied from the first excitation unit is widely distributed to reach the central portion of the wafer 200, and the excited species supplied from the second excitation unit is narrowly distributed to reach only the peripheral portion of the wafer 200. However, the excited species supplied from the first excitation unit may be narrowly distributed to reach only the peripheral portion of the wafer 200, and the excited species supplied from the second excitation unit may be widely distributed to reach the central portion of the wafer 200. That is, the in-plane distribution of excited species supplied from one excitation unit in the wafer 200 is a distribution in which the excited species reach the central portion of the wafer 200, and the in-plane distribution of another excited species supplied from the other excitation unit in the wafer 200 is a distribution in which the excited species reach portions other than the central portion of the wafer 200. Also, the in-plane distribution of the excited species supplied from one excitation unit in the wafer 200 may be a distribution in which the excited species reach the central portion of the wafer 200, and the in-plane distribution of the another excited species supplied from the other excitation unit in the wafer 200 may be a distribution in which the excited species reach the peripheral portion of the wafer 200.

The silicon nitride film formed according to the above described embodiment has a low chlorine concentration in a film, a high film density, and a high tolerance with respect to hydrogen fluoride. Therefore, the silicon nitride film formed according to the above described embodiment may be appropriately used as a gate insulating film, a capacitive insulating film, a side wall spacer, or an etching stopper. Also, for example, the silicon nitride film may be appropriately used as a hard mask in an STI forming process.

Moreover, in the above described embodiment, an example that forms the silicon nitride film as a thin film has been described, but, for example, the present disclosure may be applied to a case of forming a silicon oxide film.

In this case, by using a source gas similar to the above described embodiment as a source gas and using an oxygen-containing gas instead of a nitrogen-containing gas as a reaction gas, a film may be formed by a film forming sequence similar to the above described embodiment. For example, the oxygen-containing gas may use oxygen ($O_2$) gas, nitrous oxide ($N_2O$) gas, nitric oxide (NO) gas, nitrogen dioxide ($NO_2$) gas, ozone ($O_3$) gas, hydrogen ($H_2$) gas+oxygen ($O_2$) gas, hydrogen ($H_2$) gas+ozone ($O_3$) gas, water vapor ($H_2O$) gas, carbon monoxide (CO) gas, carbon dioxide ($CO_2$) gas, etc. A processing condition may use a processing condition similar to the above described embodiment.

Moreover, in the above described embodiment, an example which forms a silicon nitride film containing silicon (which is a semiconductor element) as a nitride film has been described above, but the present disclosure is not limited thereto. For example, the present disclosure may also be appropriately applied to a case which forms a metal nitride film containing metal elements such as titanium (Ti), zirconium (Zr), hafnium (Hf), tantalum (Ta), aluminum (Al), and molybdenum (Mo), etc.

For example, the present disclosure may be appropriately applied to a case of forming a titanium nitride film (TiN film), a case of forming a zirconium nitride film (ZrN film), a case of forming a hafnium nitride film (HfN film), a case of forming a tantalum nitride film (TaN film), a case of forming an aluminum nitride film (AlN film), or a case of forming a molybdenum nitride film (MoN film).

In this case, by using a source gas containing a metal element as a source gas, a film may be formed by a film forming sequence similar to the above described embodiment. Also, in a case where a liquid source having a liquid state is used under a normal temperature and a normal pressure, the liquid source is vaporized by a vaporization system such as a vaporizer or a bubbler, and supplied as a source gas. A nitrogen-containing gas may use any gas similar to the above described embodiment. A processing condition may use a processing condition similar to the above described embodiment.

For example, in the case of forming the TiN film, a source gas may use titanium tetrachloride ($TiCl_4$) gas, tetrakis(ethylmethylamino)titanium ($Ti[N(C_2H_5)(CH_3)]_4$, abbreviated to TEMAT) gas, tetrakis(dimethylamino)titanium ($Ti[N(CH_3)_2]_4$, abbreviated to TDMAT) gas, tetrakis(diethylamino)titanium ($Ti[N(C_2H_5)_2]_4$, abbreviated to TDEAT) gas, etc.

Moreover, for example, in the case of forming the zirconium nitride film (ZrN film), a source gas may use zirconium tetrachloride ($ZrCl_4$) gas, tetrakis(ethylmethylamino)zirconium ($Zr[N(C_2H_5)(CH_3)]_4$, abbreviated to TEMAZ) gas, tetrakis(dimethylamino)zirconium ($Zr[N(CH_3)_2]_4$, abbreviated to TDMAZ) gas, tetrakis(diethylamino)zirconium ($Zr[N(C_2H_5)_2]_4$, abbreviated to TDEAZ) gas, etc.

Moreover, for example, in the case of forming the hafnium nitride film (HfN film), a source gas may use hafnium tetrachloride ($HfCl_4$) gas, tetrakis(ethylmethylamino)hafnium ($Hf[N(C_2H_5)(CH_3)]_4$, abbreviated to TEMAH) gas, tetrakis(dimethylamino)hafnium ($Hf[N(CH_3)_2]_4$, abbreviated to TDMAH) gas, tetrakis(diethylamino)hafnium ($Hf[N(C_2H_5)_2]_4$, abbreviated to TDEAH) gas, etc.

Moreover, for example, in the case of forming the tantalum nitride film (TaN film), a source gas may use tantalum pentachloride ($TaCl_5$) gas, tantalum pentafluoride ($TaF_5$) gas, pentaethoxy tantalum ($Ta(OC_2H_5)_5$, abbreviated to PET) gas, tris(diethylamido)(tert-butylamido) tantalum ($Ta(NC(CH_3)_3)(N(C_2H_5)_2)_3$, abbreviated to TBTDET) gas, etc.

Moreover, for example, in the case of forming the aluminum nitride film (AlN film), a source gas may use aluminum trichloride ($AlCl_3$) gas, aluminum trifluoride ($AlF_3$) gas, trimethyl aluminum ($Al(CH_3)_3$, abbreviated to TMA) gas, etc.

Moreover, for example, in the case of the molybdenum nitride film (MoN film), a source gas may use molybdenum pentachloride ($MoCl_5$) gas, molybdenum pentafluoride ($MoF_5$) gas, etc.

As described above, the present disclosure may be applied to the formation of a metal nitride film as well as a silicon nitride film. Further, in such cases, operational effects similar to the above described embodiment are obtained. That is, the present disclosure may also be appropriately applied to a case of forming a nitride film containing a certain element such as a semiconductor element or a metal element.

That is, the present disclosure may also be appropriately applied to a case of forming a thin film containing a certain element such as a semiconductor element or a metal element.

Moreover, in the above described embodiment, an example has been described above in which a thin film is formed using a batch type substrate processing apparatus that processes a plurality of substrates at one time, but the present disclosure is not limited thereto. As another example, the present disclosure may also be suitably applied to a case in which a thin film is formed using a single-wafer type substrate processing apparatus that processes one or several substrate(s) at one time. Also, in the above described embodiment, an example has been described above in which a thin film is formed using a substrate processing apparatus including a hot wall type processing furnace, but the present disclosure is not limited thereto. As another example, the present disclosure may also be suitably applied to a substrate processing apparatus including a cold wall type processing furnace.

Moreover, the above described embodiments, modification examples, and application examples may be used in appropriate combination.

Moreover, for example, the present disclosure may be realized by replacing the process recipe of the existing substrate processing apparatus. In changing a process recipe, a process recipe according to the present disclosure may be installed in the existing substrate processing apparatus by using a recording medium in which an electric communication line or a process recipe thereof is recorded, the existing process recipe may be replaced by manipulating the input/output device of the existing substrate processing apparatus, or a corresponding process recipe itself may be replaced by the process recipe according to the present disclosure.

Preferred Aspects of Present Disclosure

Hereinafter, the preferred aspects of the present disclosure will be additionally stated.

(Additional Note 1)

One aspect of the present disclosure may provide a method of manufacturing a semiconductor device, including forming a thin film on a substrate by performing a cycle a predetermined number of times, the cycle including supplying a source gas to the substrate, and supplying excited species to the substrate from each of a plurality of excitation units provided at a side of the substrate, the excited species being generated by plasma-exciting a reaction gas in each of the plurality of excitation units, wherein in supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate.

(Additional Note 2)

In the method of the additional note 1, preferably, in the process of supplying the excited species from each of the plurality of excitation units, the in-plane distribution of the excited species supplied from the at least one excitation unit in the substrate is a distribution in which the excited species reaches a central portion of the substrate, and the in-plane distribution of the excited species supplied from the another excitation unit in the substrate is a distribution in which the excited species reaches another portion of the substrate other than the central portion.

(Additional Note 3)

In the method of the additional note 1 or 2, preferably, in the process of supplying the excited species from each of the plurality of excitation units, the in-plane distribution of the excited species supplied from the at least one excitation unit in the substrate is a distribution in which the excited species reaches a central portion of the substrate, and the in-plane distribution of the excited species supplied from the another excitation unit in the substrate is a distribution in which the excited species reaches a peripheral portion of the substrate.

(Additional Note 4)

In the method of any one of the additional notes 1 to 3, preferably, in the process of supplying the excited species from each of the plurality of excitation units, a supply flow rate of the reaction gas supplied to the at least one excitation unit is greater than a supply flow rate of the reaction gas supplied to the another excitation unit.

(Additional Note 5)

In the method of any one of the additional notes 1 to 4, preferably, in the process of supplying the excited species from each of the plurality of excitation units, an amount of the excited species supplied from the at least one excitation unit is greater than an amount of the excited species supplied from the another excitation unit.

(Additional Note 6)

In the method of any one of the additional notes 1 to 5, preferably, in the process of supplying the excited species from each of the plurality of excitation units, a supply time of the reaction gas supplied to the at least one excitation unit is longer than a supply time of the reaction gas supplied to the another excitation unit.

(Additional Note 7)

In the method of any one of the additional notes 1 to 6, preferably, in the process of supplying the excited species from each of the plurality of excitation units, a supply time of the excited species supplied from the at least one excitation unit is longer than a supply time of the excited species supplied from the another excitation unit.

(Additional Note 8)

In the method of any one of the additional notes 1 to 7, preferably, in the process of supplying the excited species from each of the plurality of excitation units, an electric power applied to the at least one excitation unit for plasma-exciting the reaction gas in the at least one excitation unit is greater than an electric power applied to the another excitation unit for plasma-exciting the reaction gas in the another excitation unit.

(Additional Note 9)

In the method of any one of the additional notes 1 to 8, preferably, in the process of supplying the excited species from each of the plurality of excitation units, a kind of the reaction gas supplied to the at least one excitation unit differs from a kind of the reaction gas supplied to the another excitation unit.

(Additional Note 10)

In the method of any one of the additional notes 1 to 9, preferably, an opening area of a supply hole for supplying the excited species from the at least one excitation unit differs from an opening area of a supply hole for supplying the excited species from the another excitation unit.

(Additional Note 11)

In the method of any one of the additional notes 1 to 9, preferably, a supply hole for supplying the excited species from the at least one excitation unit is formed in a direction in which the excited species flows toward a central portion of the substrate, and a supply hole for supplying the excited species from the another excitation unit is formed in a direction in which the excited species flows toward a peripheral portion of the substrate.

(Additional Note 12)

In the method of one of the additional notes 1 to 3, preferably, in the process of supplying the excited species from each of the plurality of excitation units, a condition for generating the excited species supplied from the at least one excitation unit differs from a condition for generating the excited species supplied from the another excitation unit.

(Additional Note 13)

In the method of one of the additional notes 1 to 3, preferably, in the process of supplying the excited species from each of the plurality of excitation units, a supply condition for supplying the excited species from the at least one excitation unit differs from a supply condition for supplying the excited species from the another excitation unit.

(Additional Note 14)

Another aspect of the present disclosure provides a method of processing a substrate, including forming a thin film on a substrate by performing a cycle a predetermined number of times, the cycle including supplying a source gas to the substrate, and supplying excited species to the substrate from each of a plurality of excitation units provided at a side of the substrate, the excited species being generated by plasma-exciting a reaction gas in each of the plurality of excitation units, wherein in supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate.

(Additional Note 15)

Still another aspect of the present disclosure provides a substrate processing apparatus, including a processing chamber configured to accommodate a substrate, a source gas supply system configured to supply a source gas into the processing chamber, a plurality of excitation units, each of which is provided at a side of the substrate inside the processing chamber and configured to plasma-excite a reaction gas, a reaction gas supply system configured to supply the reaction gas to each of the plurality of excitation units, and a controller configured to control the source gas supply system, the reaction gas supply system, and each of the plurality of excitation units such that a thin film is formed on the substrate by performing a cycle a predetermined number of times, the cycle including supplying the source gas to the substrate inside the processing chamber, and supplying the excited species to the substrate inside the processing chamber from each of the plurality of excitation units provided at the side of the substrate, the excited species being generated by plasma-exciting the reaction gas in each of the plurality of excitation units, wherein in supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate.

(Additional Note 16)

Yet another aspect of the present disclosure provides a program that causes a computer to perform a process that forms a thin film on a substrate by performing a cycle a predetermined number of times, the cycle including supplying a source gas to the substrate inside a processing chamber of a substrate processing apparatus, and supplying excited species to the substrate inside the processing chamber from each of a plurality of excitation units provided at a side of the substrate, the excited species being generated by plasma-exciting a reaction gas in each of the plurality of excitation units, wherein in supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate.

(Additional Note 17)

Yet another aspect of the present disclosure provides a non-transitory computer-readable recording medium storing a program that causes a computer to perform a process that forms a thin film on a substrate by performing a cycle a predetermined number of times, the cycle including supplying a source gas to the substrate inside a processing chamber of a substrate processing apparatus, and supplying excited species to the substrate inside the processing chamber through each of a plurality of excitation units provided at a side of the substrate, the excited species being generated by plasma-exciting a reaction gas in each of the plurality of excitation units, wherein in supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a thin film on a substrate by performing a cycle a predetermined number of times, the cycle including:
    supplying a source gas to the substrate; and
    supplying, to the substrate, excited species from each of a plurality of excitation units provided at a side of the substrate, the excited species being generated by plasma-exciting a reaction gas in each of the plurality of excitation units,
    wherein in supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate, and
    wherein in supplying the excited species from each of the plurality of excitation units, a type of the reaction gas supplied to the at least one excitation unit differs from a type of the reaction gas supplied to the another excitation unit.

2. The method according to claim 1, wherein in supplying the excited species from each of the plurality of excitation units, the in-plane distribution of the excited species supplied from the at least one excitation unit in the substrate is a distribution in which the excited species reaches a central portion of the substrate, and the in-plane distribution of the excited species supplied from the another excitation unit in the substrate is a distribution in which the excited species reaches another portion of the substrate other than the central portion.

3. The method according to claim 1, wherein in supplying the excited species from each of the plurality of excitation units, the in-plane distribution of the excited species supplied from the at least one excitation unit in the substrate is a distribution in which the excited species reaches a central portion of the substrate, and the in-plane distribution of the excited species supplied from the another excitation unit in the substrate is a distribution in which the excited species reaches a peripheral portion of the substrate.

4. The method according to claim 1, wherein in supplying the excited species from each of the plurality of excitation units, a supply flow rate of the reaction gas supplied to the at least one excitation unit is greater than a supply flow rate of the reaction gas supplied to the another excitation unit.

5. The method according to claim 1, wherein in supplying the excited species from each of the plurality of excitation units, an amount of the excited species supplied from the at least one excitation unit is greater than an amount of the excited species supplied from the another excitation unit.

6. The method according to claim 1, wherein in supplying the excited species from each of the plurality of excitation units, a supply time of the reaction gas supplied to the at least one excitation unit is longer than a supply time of the reaction gas supplied to the another excitation unit.

7. The method according to claim 1, wherein in supplying the excited species from each of the plurality of excitation units, a supply time of the excited species supplied from the at least one excitation unit is longer than a supply time of the excited species supplied from the another excitation unit.

8. The method according to claim 1, wherein in supplying the excited species from each of the plurality of excitation units, an electric power applied to the at least one excitation unit for plasma-exciting the reaction gas in the at least one excitation unit is greater than an electric power applied to the another excitation unit for plasma-exciting the reaction gas in the another excitation unit.

9. The method according to claim 1, wherein an opening area of a supply hole for supplying the excited species from the at least one excitation unit differs from an opening area of a supply hole for supplying the excited species from the another excitation unit.

10. The method according to claim 1, wherein a supply hole for supplying the excited species from the at least one excitation unit is formed in a direction in which the excited species flows toward a central portion of the substrate, and a supply hole for supplying the excited species from the another excitation unit is formed in a direction in which the excited species flows toward a peripheral portion of the substrate.

11. The method according to claim 1, wherein in supplying the excited species from each of the plurality of excitation units, a condition for generating the excited species supplied from the at least one excitation unit differs from a condition for generating the excited species supplied from the another excitation unit.

12. The method according to claim 1, wherein in supplying the excited species from each of the plurality of excitation units, a supply condition for supplying the excited species from the at least one excitation unit differs from a supply condition for supplying the excited species from the another excitation unit.

13. A method of processing a substrate, comprising forming a thin film on the substrate by performing a cycle a predetermined number of times, the cycle including:
    supplying a source gas to the substrate; and
    supplying, to the substrate, excited species from each of a plurality of excitation units provided at a side of the substrate, the excited species being generated by plasma-exciting a reaction gas in each of the plurality of excitation units,
    wherein in supplying the excited species from each of the plurality of excitation units, an in-plane distribution of the excited species supplied from at least one of the plurality of excitation units in the substrate differs from an in-plane distribution of the excited species supplied from another excitation unit, other than the at least one excitation unit, among the plurality of excitation units, in the substrate, and
    wherein in supplying the excited species from each of the plurality of excitation units, a type of the reaction gas supplied to the at least one excitation unit differs from a type of the reaction gas supplied to the another excitation unit.

* * * * *